US012581646B2

(12) United States Patent
Cha et al.

(10) Patent No.: US 12,581,646 B2
(45) Date of Patent: Mar. 17, 2026

(54) SEMICONDUCTOR DEVICES WITH ALIGN KEY STRUCTURE FOR STACK STRUCTURES AND DATA STORAGE SYSTEMS INCLUDING THE SAME

(71) Applicant: Samsung Electronics Co., Ltd., Suwon-si (KR)

(72) Inventors: Taehwan Cha, Suwon-si (KR); Minjae Oh, Hwaseong-si (KR); Kyungtae Jang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 989 days.

(21) Appl. No.: 17/735,150

(22) Filed: May 3, 2022

(65) Prior Publication Data

US 2023/0049165 A1 Feb. 16, 2023

(30) Foreign Application Priority Data

Aug. 13, 2021 (KR) ......................... 10-2021-0107238

(51) Int. Cl.
*H10B 41/27* (2023.01)
*H10B 41/35* (2023.01)
(Continued)

(52) U.S. Cl.
CPC ............. *H10B 41/27* (2023.02); *H10B 41/35* (2023.02); *H10B 41/40* (2023.02); *H10B 43/27* (2023.02); *H10B 43/35* (2023.02); *H10B 43/40* (2023.02)

(58) Field of Classification Search
CPC ........ H10B 41/27; H10B 41/35; H10B 41/40; H10B 43/27; H10B 43/35; H10B 43/40;
(Continued)

(56) References Cited

U.S. PATENT DOCUMENTS

| | | | |
|---|---|---|---|
| 7,511,372 B2 * | 3/2009 | Chiu | ..................... H01L 23/473 |
| | | | 257/706 |
| 8,741,761 B2 | 6/2014 | Lee et al. | |

(Continued)

FOREIGN PATENT DOCUMENTS

| | | |
|---|---|---|
| KR | 10-2012-0122764 A | 11/2012 |
| KR | 10-2017-0134039 A | 12/2017 |

(Continued)

*Primary Examiner* — Caleb E Henry
(74) *Attorney, Agent, or Firm* — Wolf, Greenfield & Sacks, P.C.

(57) ABSTRACT

Semiconductor devices may include a first stack structure including interlayer insulating layers and gate electrodes alternately stacked in a first direction perpendicular to an upper surface of a substrate on a first region of the substrate and including a first lower stack structure and a first upper stack structure, a second stack structure including the interlayer insulating layers and sacrificial insulating layers alternately stacked in the first direction on a second region of the substrate and including a second lower stack structure and a second upper stack structure, a channel structure penetrating the first upper stack structure and the first lower stack structure, extending in the first direction, and including a channel layer, and an align key structure penetrating the second lower stack structure and extending in the first direction. The second upper stack structure may include a first align key region on the align key structure.

20 Claims, 31 Drawing Sheets

(51) Int. Cl.

| | |
|---|---|
| *H10B 41/40* | (2023.01) |
| *H10B 43/27* | (2023.01) |
| *H10B 43/35* | (2023.01) |
| *H10B 43/40* | (2023.01) |

(58) Field of Classification Search
 CPC ..... H10B 43/10; H10B 43/30; H01L 25/0657; H01L 25/105; H01L 25/50; H01L 2225/1052; H01L 25/18; H01L 23/544; H01L 2225/06593
 See application file for complete search history.

(56) References Cited

U.S. PATENT DOCUMENTS

| | | | | |
|---|---|---|---|---|
| 8,946,023 | B2 | 2/2015 | Makala et al. | |
| 8,952,426 | B2 * | 2/2015 | Maejima | H10B 43/20 |
| | | | | 257/214 |
| 9,287,271 | B2 * | 3/2016 | Wang | H10B 12/053 |
| 9,437,606 | B2 * | 9/2016 | Makala | H10D 88/01 |
| 9,508,730 | B2 * | 11/2016 | Lee | H10N 70/25 |
| 9,576,973 | B2 * | 2/2017 | Lee | H10B 43/10 |
| 9,613,689 | B1 * | 4/2017 | Takaki | H01L 23/528 |
| 9,679,907 | B1 * | 6/2017 | Kaneko | H10B 43/35 |
| 9,853,043 | B2 | 12/2017 | Lu et al. | |
| 9,875,929 | B1 * | 1/2018 | Shukla | H10B 43/27 |
| 9,911,751 | B2 | 3/2018 | Kwon et al. | |
| 10,134,752 | B2 * | 11/2018 | Kim | H10B 43/27 |
| 10,141,221 | B1 * | 11/2018 | Lai | H01L 21/76831 |
| 10,163,924 | B2 * | 12/2018 | Ahn | H10B 41/27 |
| 10,217,719 | B2 * | 2/2019 | Watanabe | H01L 23/5389 |
| 10,217,746 | B1 * | 2/2019 | Kim | H10B 63/845 |
| 10,290,648 | B1 * | 5/2019 | Zhou | H10B 41/27 |
| 10,354,987 | B1 * | 7/2019 | Mushiga | H01L 24/80 |
| 10,381,443 | B2 * | 8/2019 | Matsumoto | H10B 43/27 |
| 10,418,374 | B2 | 9/2019 | Lee et al. | |
| 10,504,873 | B1 * | 12/2019 | Chen | H01L 24/09 |
| 10,510,738 | B2 * | 12/2019 | Kim | H01L 24/80 |
| 10,515,897 | B2 * | 12/2019 | Nishikawa | H01L 21/76847 |
| 10,515,907 | B2 * | 12/2019 | Fujita | H10B 43/27 |
| 10,522,624 | B2 * | 12/2019 | Van Houdt | H10N 70/20 |
| 10,559,582 | B2 * | 2/2020 | Nishikawa | H10B 43/27 |
| 10,777,539 | B2 * | 9/2020 | Chu | H01L 23/481 |
| 11,563,021 | B2 * | 1/2023 | Huang | H10B 43/35 |
| 2010/0213596 | A1 * | 8/2010 | Kim | H01L 24/48 |
| | | | | 257/E23.068 |

| | | | | |
|---|---|---|---|---|
| 2012/0276719 | A1 | 11/2012 | Han et al. | |
| 2013/0037950 | A1 * | 2/2013 | Yu | H01L 23/5226 |
| | | | | 257/E23.021 |
| 2014/0124956 | A1 * | 5/2014 | Lee | H01L 24/49 |
| | | | | 257/777 |
| 2015/0102505 | A1 * | 4/2015 | Chung | H01L 25/0657 |
| | | | | 438/109 |
| 2016/0027764 | A1 * | 1/2016 | Kim | H01L 23/3135 |
| | | | | 257/686 |
| 2016/0268263 | A1 * | 9/2016 | Lee | H10B 43/10 |
| 2016/0365352 | A1 * | 12/2016 | Nishikawa | H10B 43/10 |
| 2017/0053906 | A1 * | 2/2017 | Or-Bach | H10B 43/20 |
| 2017/0162597 | A1 * | 6/2017 | Sharangpani | H01L 21/02178 |
| 2017/0194266 | A1 * | 7/2017 | Kwon | H01L 24/73 |
| 2017/0213845 | A1 * | 7/2017 | Baba | H10B 43/27 |
| 2017/0236836 | A1 * | 8/2017 | Huo | H10D 1/00 |
| | | | | 257/324 |
| 2017/0373089 | A1 * | 12/2017 | Kim | H10B 43/27 |
| 2018/0277556 | A1 * | 9/2018 | Kang | H10B 43/10 |
| 2018/0342557 | A1 * | 11/2018 | Mori | H10N 70/823 |
| 2019/0074290 | A1 * | 3/2019 | Xiao | H10D 30/696 |
| 2019/0355735 | A1 * | 11/2019 | Kothari | H01L 21/32139 |
| 2020/0051904 | A1 * | 2/2020 | Tang | H10B 63/00 |
| 2020/0126974 | A1 * | 4/2020 | Liu | H10D 62/292 |
| 2020/0161321 | A1 * | 5/2020 | Guo | H10B 43/40 |
| 2020/0235120 | A1 * | 7/2020 | Kai | H10B 43/40 |
| 2020/0350203 | A1 * | 11/2020 | Fratin | H10B 63/845 |
| 2020/0357811 | A1 * | 11/2020 | Kim | H10B 41/35 |
| 2020/0388650 | A1 * | 12/2020 | Nardi | G11C 13/0026 |
| 2020/0395407 | A1 * | 12/2020 | Takahashi | H10N 70/066 |
| 2020/0395408 | A1 * | 12/2020 | Takahashi | H10B 63/845 |
| 2020/0402988 | A1 * | 12/2020 | Howder | H10B 43/27 |
| 2020/0403033 | A1 * | 12/2020 | Lilak | H10B 43/50 |
| 2021/0028058 | A1 | 1/2021 | Kim | |
| 2021/0159149 | A1 * | 5/2021 | Kitazawa | H10B 43/10 |
| 2021/0265364 | A1 * | 8/2021 | Huang | H10B 43/20 |
| 2021/0313246 | A1 * | 10/2021 | Matsumura | H10B 43/40 |
| 2021/0313281 | A1 * | 10/2021 | Kaminaga | H10B 43/10 |
| 2021/0391345 | A1 * | 12/2021 | Otsu | H10B 43/35 |
| 2022/0130797 | A1 * | 4/2022 | Kang | H01L 25/0652 |
| 2022/0302041 | A1 * | 9/2022 | Kim | H10B 43/50 |
| 2024/0234332 | A1 * | 7/2024 | Park | H10B 43/50 |

FOREIGN PATENT DOCUMENTS

| | | | |
|---|---|---|---|
| KR | 10-2020-0133113 | A | 11/2020 |
| KR | 10-2021-0032891 | A | 3/2021 |

* cited by examiner

SEMICONDUCTOR DEVICES WITH ALIGN KEY STRUCTURE FOR STACK STRUCTURES AND DATA STORAGE SYSTEMS INCLUDING THE SAME

CROSS TO REFERENCE TO RELATED APPLICATION(S)

This application claims priority to Korean Patent Application No. 10-2021-0107238 filed on Aug. 13, 2021 in the Korean Intellectual Property Office, the disclosure of which is incorporated herein by reference in its entirety.

BACKGROUND

Example embodiments of the present inventive concept relate to a semiconductor device and a data storage system including the same.

There has been demand for a semiconductor device which may store high-capacity data in a data storage system. Accordingly, measures for increasing the data storage capacity of a semiconductor device have been studied. For example, as one method of increasing the data storage capacity of a semiconductor device, a semiconductor device including memory cells arranged three-dimensionally, instead of memory cells arranged two-dimensionally, has been suggested.

SUMMARY

An example embodiment of the present inventive concept is to provide a semiconductor device having an improved production yield.

According to an example embodiment of the present inventive concept, a data storage system including a semiconductor device having an improved production yield is provided.

According to an example embodiment of the present disclosure, a semiconductor device includes a first stack structure including interlayer insulating layers and gate electrodes alternately stacked in a first direction perpendicular to an upper surface of a substrate on a first region of the substrate, and including a first lower stack structure on the substrate and a first upper stack structure on the first lower stack structure, a second stack structure including the interlayer insulating layers and sacrificial insulating layers alternately stacked in the first direction on a second region disposed on outside of the first region of the substrate, and including a second lower stack structure on the substrate and a second upper stack structure on the second lower stack structure, a channel structure penetrating the first upper stack structure and the first lower stack structure, extending in the first direction, and including a channel layer, and an align key structure penetrating the second lower stack structure and extending in the first direction, wherein the second upper stack structure includes a first align key region on the align key structure.

According to an example embodiment of the present disclosure, a semiconductor device includes a first structure including gate electrodes stacked and spaced apart from each other in a first direction perpendicular to an upper surface of a substrate on a first region of the substrate, and a channel structure penetrating the gate electrodes, extending in the first direction, and including a channel layer, and a second structure including a lower stack structure including lower sacrificial insulating layers and lower interlayer insulating layers alternately stacked in the first direction on a second region of the substrate, an align key structure penetrating the lower stack structure and extending in the first direction, and an upper stack structure including upper sacrificial insulating layers and upper interlayer insulating layers alternately stacked in the first direction on the lower stack structure and the align key structure, wherein a level of a first portion of an upper surface of the upper stack structure on the align key structure is different from a level of a second portion of the upper surface of the upper stack structure on the lower stack structure. In some embodiments, the first portion of the upper surface of the upper stack structure on the align key structure and the second portion of the upper surface of the upper stack structure on the lower stack structure may be at different distances from the upper surface of the substrate.

According to an example embodiment of the present disclosure, a data storage system includes a main substrate, a semiconductor device on the main substrate, and a controller electrically connected to the semiconductor device on the main substrate, wherein the semiconductor device includes a first stack structure including interlayer insulating layers and gate electrodes alternately stacked in a first direction perpendicular to an upper surface of a substrate on a first region of the substrate, and including a first lower stack structure on the substrate and a first upper stack structure on the first lower stack structure, a second stack structure including the interlayer insulating layers and sacrificial insulating layers alternately stacked in the first direction on a second region disposed on outside of the first region of the substrate, and including a second lower stack structure on the substrate and a second upper stack structure on the second lower stack structure, a channel structure penetrating the first upper stack structure and the first lower stack structure, extending in the first direction, and including a channel layer, and an align key structure penetrating the second lower stack structure and extending in the first direction, a peripheral circuit including circuit devices electrically connected to the gate electrodes or the channel structure, and an input/output pad electrically connected to the peripheral circuit, wherein the second upper stack structure includes a first align key region on the align key structure.

BRIEF DESCRIPTION OF DRAWINGS

The above and other aspects, features, and advantages of the present invention will be more clearly understood from the following detailed description, taken in conjunction with the accompanying drawings, in which.

DETAILED DESCRIPTION

Hereinafter, example embodiments of the present inventive concept will be described as follows with reference to the accompanying drawings.

Figure 1:
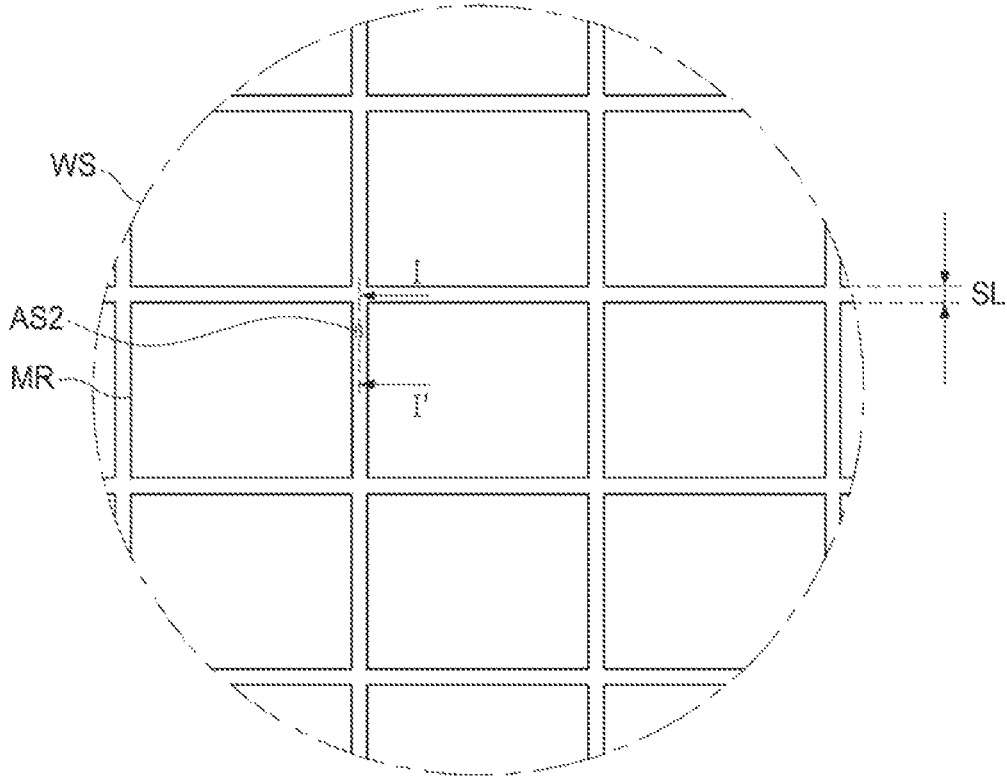
FIG. 1 is a diagram illustrating a portion of a wafer structure for manufacturing a semiconductor device according to an example embodiment of the present inventive concept.

FIG. 1 is a diagram illustrating a portion of a wafer structure for manufacturing a semiconductor device according to an example embodiment of the present inventive concept.

Figure 2:
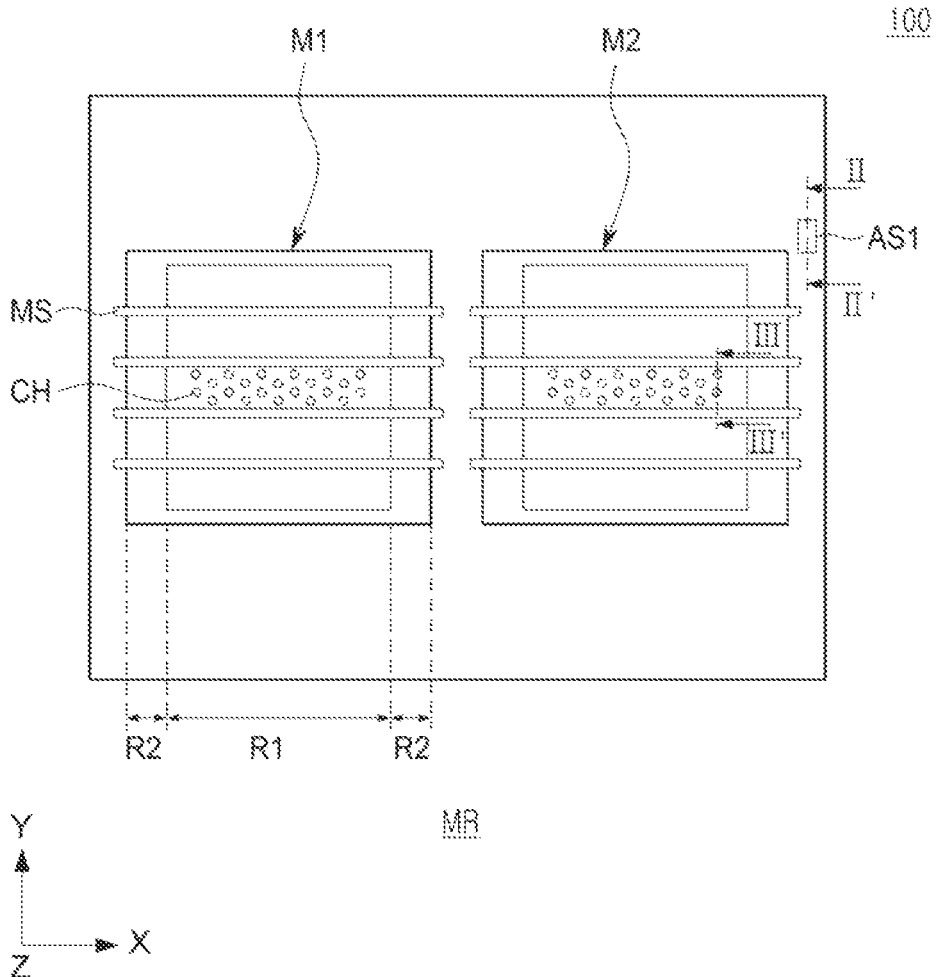
FIG. 2 is a plan diagram illustrating a semiconductor device according to an example embodiment of the present inventive concept.

FIG. 2 is a plan diagram illustrating a semiconductor device 100 according to an example embodiment.

Figure 3:
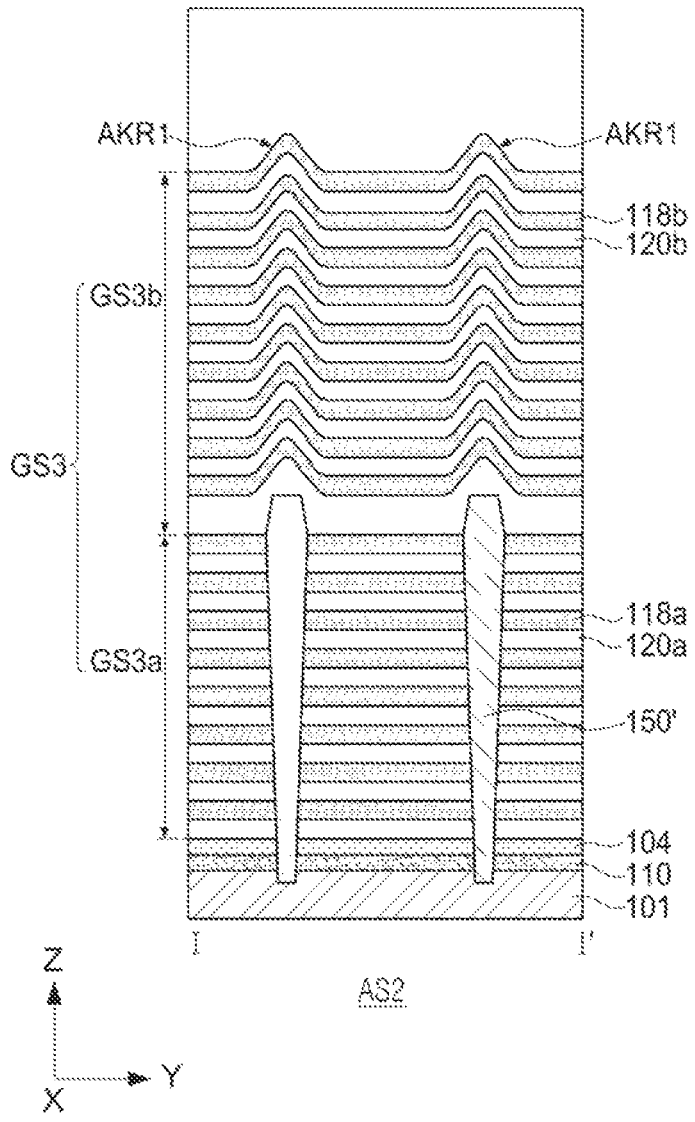
FIG. 3 is a cross-sectional diagram illustrating a wafer structure according to an example embodiment of the present inventive concept.
Figure 4:
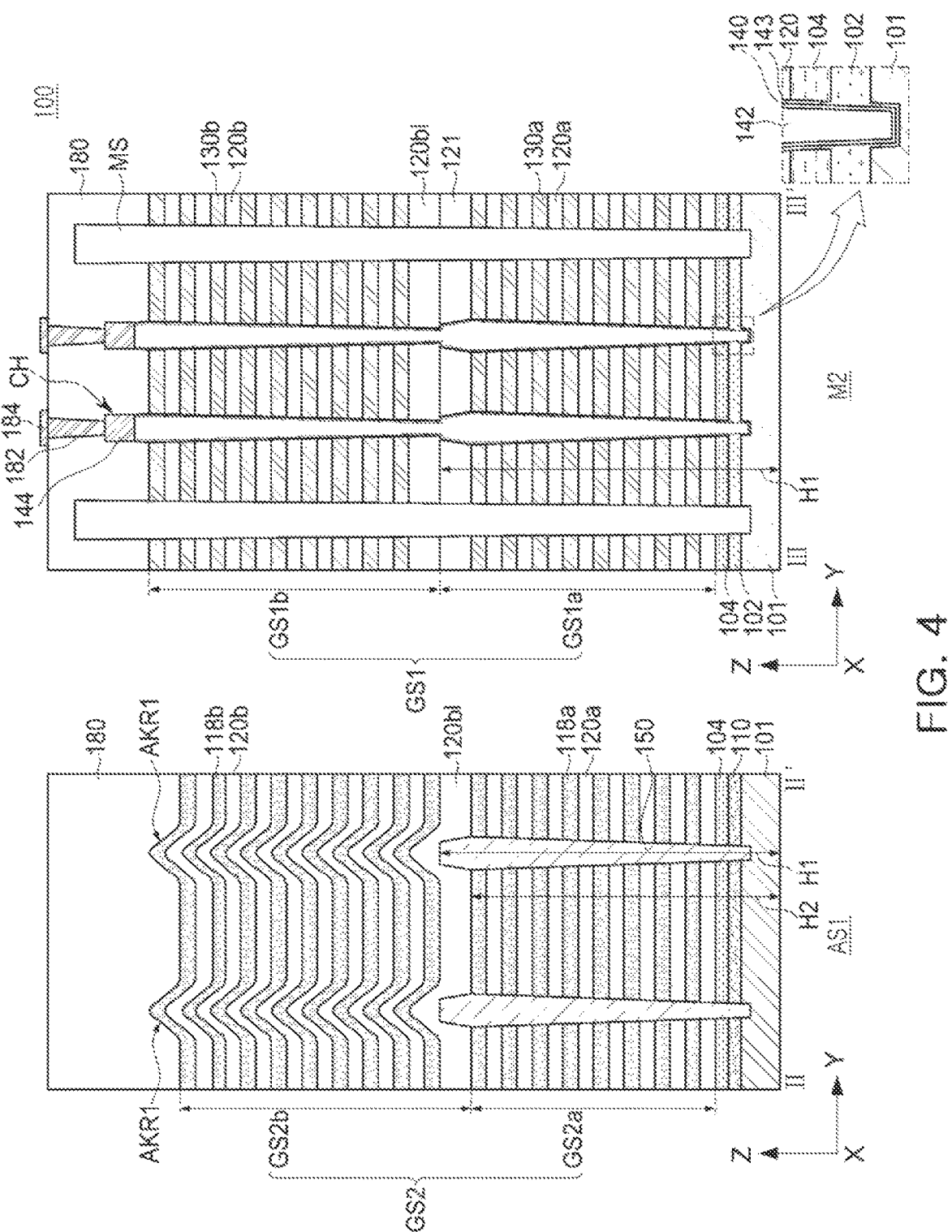
FIG. 4 is a cross-sectional diagram illustrating a semiconductor device according to an example embodiment of the present inventive concept.

FIG. 3 is a cross-sectional diagram illustrating a wafer structure WS according to an example embodiment, taken along line in FIG. 1. FIG. 4 is a cross-sectional diagram illustrating a semiconductor device 100 according to an example embodiment, taken along line II-II' and in FIG.

Referring to FIG. 1, the wafer structure WS for manufacturing a semiconductor device may include a plurality of main regions MR and a scribe lane region SL. The plurality of main regions MR may be spaced apart from each other by a scribe lane region SL.

The scribe lane region SL may be configured to separate the plurality of main regions MR by cutting the wafer structure WS in a sawing process after the process of manufacturing the main region MR on the wafer structure WS is completed. Each of the plurality of main regions MR may be referred to as a "semiconductor device," a "semiconductor chip," or a "die." In an example embodiment, the main region MR may have a rectangular shape in the plan diagram, but the shape of the main region MR is not limited thereto.

The wafer structure WS may include the semiconductor device 100 in the main region MR and the second align structure AS2 in the scribe lane region SL.

Referring to FIG. 2, the semiconductor device 100 may include a plurality of memory structures M1 and M2 and a first align structure AS1 disposed on an external side of the plurality of memory structures M1 and M2. In some embodiments, the first align structure AS1 may be outside of the plurality of memory structures M1 and M2 and may be spaced apart from the plurality of memory structures M1 and M2. In an example embodiment, the first align structure AS1 may be disposed adjacent to the edge of the main region MR, but a specific position in which the first align structure AS1 is disposed is not limited thereto. In an example embodiment, the semiconductor device 100 may include two memory structures M1 and M2, but the number of the plurality of memory structures M1 and M2 is not limited thereto and may be more than two.

Referring to FIG. 2, each of the plurality of memory structures M1 and M2 may include separation structures MS, a first region R1 disposed between the separation structures MS, and a second region R2 disposed on at least one side of the first region R1. The first region R1 may be configured as a memory cell array region or a memory cell region. The second region R2 may be configured as a step region. The memory cell array region may be defined as a memory block.

Referring to FIGS. 2 to 4, each of the plurality of memory structures M1 and M2 may include a substrate 101, a first horizontal conductive layer 102, a horizontal insulating layer 110, a second horizontal conductive layer 104, gate electrodes 130a and 130b stacked on the substrate 101, interlayer insulating layers 120a and 120b alternately stacked with the gate electrodes 130a and 130b on the substrate 101, and channel structures CFI disposed to penetrate the stack structure and each including the channel layer 140, the separation structures MS extending by penetrating the stack structure, and an upper insulating layer 180 covering the channel structures CH.

Referring to FIGS. 1 to 4, the first and second align structures AS1 and AS2 may include a substrate 101, a horizontal insulating layer 110 on the substrate 101, a second horizontal conductive layer 104, sacrificial insulating layers 118a and 118b stacked on the substrate 101, interlayer insulating layers 120a and 120b alternately stacked with the sacrificial insulating layers 118a and 118b on the substrate 101, first and second align key structures 150 and 150' disposed to penetrate at least a portion of the stack structure, and an upper insulating layer 180.

The substrate 101 may have an upper surface extending in the x-direction and the y-direction. The substrate 101 may include a semiconductor material, such as, for example, a group IV semiconductor, a group III-V compound semiconductor, or a group II-VI compound semiconductor. For example, the group IV semiconductor may include silicon, germanium, or silicon-germanium. The substrate 101 may be provided as a bulk water, an epitaxial layer, an epitaxial layer, a silicon on insulator (SOI) layer, a semiconductor on insulator (SeOI) layer, or the like. As used herein, a lower surface of an element A may refer to a surface of the element A facing the substrate 101, and an upper surface of the element A is opposite the lower surface thereof.

The first and second horizontal conductive layers 102 and 104 may be stacked in order on the upper surface of the substrate 101. The horizontal insulating layer 110 may be spaced apart from the first horizontal conductive layer 102 on the upper surface of the substrate 101 and may be disposed in parallel with the first horizontal conductive layer 102. The horizontal insulating layers 110 may be the layers remaining; after a portion of the horizontal insulating layers are replaced with the first horizontal conductive layer 102 in the process of manufacturing the semiconductor device 100. The second horizontal conductive layer 104 may cover the first horizontal conductive layer 102 and the horizontal insulating layer 110.

In each of the plurality of memory structures M1 and M2, the first horizontal conductive layer 102 may be disposed on the first region R1 and may not extend onto the second region R2. In each of the plurality of memory structures M1 and M2, the horizontal insulating layer 110 may be disposed on the second region R2. The second horizontal conductive layer 104 may extend to the substrate 101 and may be in contact with the substrate 101 in a region in which the first horizontal conductive layer 102 and the horizontal insulating layer 110 are not disposed.

In each of the first and second align structures AS1 and AS2, the first horizontal conductive layer 102 may not be disposed. That is, in each of the first and second align structures AS1 and AS2, the horizontal insulating layer 110 and the second horizontal conductive layer 104 may be stacked in order on the substrate 101.

The first horizontal conductive layer 102 may function as at least a portion of a common source line of the semiconductor device 100, that is, for example, a common source line together with the substrate 101. As illustrated in the enlarged diagram in FIG. 4, the first horizontal conductive layer 102 may be directly connected to the channel layer 140.

The first and second horizontal conductive layers 102 and 104 may include a semiconductor material, such as polycrystalline silicon. In this case, at least the first horizontal conductive layer 102 may be doped with impurities of the same conductivity type as that of the substrate 101, and the second horizontal conductive layer 104 may be a doped layer or may include impurities diffused from the first horizontal conductive layer 102. However, the material of the second horizontal conductive layer 104 is not limited to the semiconductor material.

The horizontal insulating layer 110 may include first to third horizontal insulating layers stacked in order. The horizontal insulating layer 110 may include silicon oxide, silicon nitride, silicon carbide, and/or silicon oxynitride. The first and third horizontal insulating layers may include an insulating material different from that of the second horizontal insulating layers. The first and third horizontal insulating layers may include the same material. For example, the first and third horizontal insulating layers may be formed of the same material as that of the interlayer insulating layers 120a and 120b, and the second horizontal insulating layer may be formed of the same material as that of the sacrificial insulating layers 118a and 118b.

The gate electrodes 130a and 130b may be vertically stacked and spaced apart from each other on the substrate 101 and may form the first stack structure GS1. Each of the plurality of memory structures M1 and M2 may include a first stack structure GS1. The first stack structure GS1 may include a first lower stack structure GS1a on the substrate 101 and a first upper stack structure GS1b on the first lower stack structure GS1a.

The gate electrodes 130a and 130b may include a lower gate electrode forming a gate of a ground select transistor, memory gate electrodes forming a plurality of memory cells, and an upper gate electrode forming gates of string select transistors. The number of the memory gate electrodes included in the memory cells may be determined according to the capacity of the semiconductor device 100. According to an example embodiment, the number of each of the upper and lower gate electrodes may be one or two or more, and each of the upper and lower gate electrodes may have a structure the same as or different from the memory gate electrodes. In example embodiments, the gate electrodes 130a and 130b may further include a gate electrode 130a and 130b disposed above the upper gate electrodes and/or below the lower gate electrodes and forming an erase transistor used in an erase operation using a gate induced leakage current (GIDL). Also, a portion of the gate electrodes 130a and 130b, such as, for example, the memory gate electrodes adjacent to the upper or lower gate electrodes may be dummy gate electrodes.

The gate electrodes 130a and 130b may be vertically stacked and spaced apart from each other and stacked on the first region R1, and may extend from the first region R1 to the second region R2 by different lengths and may form a step structure in a step shape. The gate electrodes 130a and 130b may form a step structure between the gate electrodes 130a and 130b in the x direction. In example embodiments, at least a portion of the gate electrodes 130a and 130b, that is, for example, two to six gate electrodes 130a and 130b may form a single gate group, and may form a step structure between the gate groups in the x direction.

The gate electrodes 130a and 130b may include a metal material, such as, for example, tungsten (W). In example embodiments, the gate electrodes 130a and 130b may include polycrystalline silicon or a metal silicide material. In example embodiments, the gate electrodes 130a and 130b may further include a diffusion barrier, and for example, the diffusion barrier may include tungsten nitride (WN), tantalum nitride (TaN), or titanium nitride (TiN), or a combination thereof.

The sacrificial insulating layers 118a and 118b may be vertically stacked and spaced apart from each other on the substrate 101 and may form the second stack structure GS2 and the third stack structure GS3. The first align structure AS1 may include a second stack structure GS2, and the second align structure AS2 may include a third stack structure GS3. The second stack structure GS2 may include a second lower stack structure GS2a on the substrate 101 and a second upper stack structure GS2b on the second lower stack structure GS2a. The third stack structure GS3 may include a third lower stack structure GS3a on the substrate 101 and a third upper stack structure GS3b on the third lower stack structure GS3a.

The sacrificial insulating layers 118a and 118b may be spaced apart from the gate electrodes 130a and 130b and may be disposed in parallel with the gate electrodes 130a and 130b. The sacrificial insulating layers 118a and 118b may be the layers remaining after a portion of the sacrificial insulating layers are replaced with the gate electrodes 130a and 130b during the process of manufacturing the semiconductor device 100.

The sacrificial insulating layers 118a and 118b may include an insulating material different from that of the interlayer insulating layers 120a and 120b. For example, the sacrificial insulating layers 118a and 118b may include silicon oxynitride, and the interlayer insulating layers 120a and 120b may include silicon oxide.

The interlayer insulating layers 120a and 120b may be disposed between the gate electrodes 130a and 130b or between the sacrificial insulating layers 118a and 118b. A portion of the interlayer insulating layers 120a and 120b may be alternately stacked with the gate electrodes 130a and 130b and may form the first stack structure GS1. The other portions of the interlayer insulating layers 120a and 120b may be alternately stacked with the sacrificial insulating layers 118a and 118b and may form the second and third stack structures GS2 and GS3. The interlayer insulating layers 120a and 120b may include an insulating material such as silicon oxide or silicon nitride.

The first lower stack structure GS1a may include lower interlayer insulating layers 120a and lower gate electrodes 130a alternately stacked on the substrate 101, and may further include a connection insulating layer 121 disposed on an uppermost gate electrode 130a among the lower gate electrodes 130a. The connection insulating layer 121 may include an insulating material, such as, for example, at least one of silicon oxide, silicon nitride, and silicon oxynitride. The connection insulating layer 121 may include the same material as that of the interlayer insulating layers 120a and 120b.

The first upper stack structure GS1b may include upper interlayer insulating layers 120b and upper gate electrodes 1301) alternately stacked on the first lower stack structure GS1a.

The second lower stack structure GS2a may include lower interlayer insulating layers 120a and lower sacrificial insulating layers 118a alternately stacked on the substrate 101, and may not include the connection insulating layer 121. The lower sacrificial insulating layers 118a of the second lower stack structure GS2a may be disposed in parallel with the lower gate electrodes 130a of the first lower stack structure GS1a. Accordingly, the upper surface of the first lower stack structure GS1a including the connection insulating layer 121 may be disposed on a level higher than a level of an upper surface of the second lower stack structure GS2a not including the connection insulating layer 121. As used herein, "a surface/level A is lower than a surface/level B" (or similar language) means that the surface/level A is closer than the surface B to the substrate 101 (e.g., an upper surface of the substrate 101).

The second upper stack structure GS2b may include upper interlayer insulating layers 120b and upper sacrificial insulating layers 118b alternately stacked on the second lower stack structure GS2a.

The channel structures CH may be disposed in the first region R1 in each of the plurality of memory structures M1 and M2.

Each of the channel structures CH may include a lower channel structure penetrating the first lower stack structure GS1a and an upper channel structure penetrating the first upper stack structure GS1b. The upper channel structure may penetrate the first upper stack structure GS1b and may be connected to the lower channel structure. That is, the lower channel structure and the upper channel structure may be connected to each other. The upper surface of the lower channel structure and the lower surface of the upper channel structure may be disposed on substantially the same level as a level of the upper surface of the first lower stack structure GS1a. The upper surface of the lower channel structure may be disposed on substantially the same level as a level of the upper surface of the connection insulating layer 121. In the example embodiment, the configuration in which the elements are disposed on substantially the same level may include a slight difference in levels caused by a process error even though the elements are formed through the same process.

The channel structures CH may form a single memory cell string, and may be spaced apart from each other on the substrate 101 while forming rows and columns. The channel structures CH may be disposed to form a grid pattern on an x-y plane or may be disposed in a zigzag pattern in one direction. The channel structures CH may have a hole shape and a pillar shape, and may have inclined side surfaces of which a width decreases towards the substrate 101 depending on an aspect ratio.

Each of the lower channel structure and the upper channel structure may have an inclined side surface, and a width of each of the lower channel structure and the upper channel structure may decrease towards the substrate 101. In an example embodiment, a width of an uppermost portion of the lower channel structure may be greater than a width of a lowermost portion of the upper channel structure. Accordingly, the channel structures CH may include a bent portion formed as the width changes on a level of a region in which the lower channel structure and the upper channel structure are connected to each other.

As illustrated in the enlarged diagram in FIG. 4, each of the channel structures CH may further include a gate dielectric layer 143, a channel buried insulating layer 142 between the channel layers 140, and a channel pad 144 on an upper end, in addition to the channel layer 140.

The channel layer 140 may be formed in an annular shape surrounding the channel buried insulating layer 142 therein, but according to an example embodiment, the channel layer 140 may have a columnar shape such as a cylindrical shape or a prism shape. The channel layer 140 may be connected to the first horizontal conductive layer 102 in a lower portion of the channel layer 140. The channel layer 140 may include a semiconductor material such as polycrystalline silicon or single crystal silicon, and the semiconductor material may be an undoped material or a material containing p-type or n-type impurities.

The gate dielectric layer 143 may be disposed between the gate electrodes 130a and 130b and the channel layer 140. Although not specifically illustrated, the gate dielectric layer 143 may include a tunneling layer, a charge storage layer, and a blocking layer stacked in order from the channel layer 140. The tunneling layer may allow tunneling of electric charges into the charge storage layer, and may include, for example, silicon oxide ($SiO_2$), silicon nitride ($Si_3N_4$), silicon oxynitride (SiON), or a combination thereof. The charge storage layer may be a charge trap layer or a floating gate conductive layer. The blocking layer may include silicon oxide ($SiO_2$), silicon nitride ($Si_3N_4$), silicon oxynitride (SiON), a high-k dielectric material, or a combination thereof. In example embodiments, at least a portion of the gate dielectric layer 143 may extend in a horizontal direction along the gate electrodes 130a and The channel pad 144 may be disposed on the channel layer 140 in each of the channel structures CH. The channel pad 144 may be disposed to cover the upper surface of the channel buried insulating layer 142 and may be electrically connected to the channel layer 140. The channel pad 144 may include, for example, doped polycrystalline silicon.

The separation structures MS may penetrate the gate electrodes 130a and 130b, the interlayer insulating layers 120a and 120b, and the first and second horizontal conductive layers 102 and 104, may extend in the z direction, and may be connected to the substrate 101. The separation structures MS may be disposed in trenches extending in the x-direction, respectively. The separation structures MS may be spaced apart from each other in the y-direction. That is, the separation structures MS may separate the gate electrodes 130a and 130b from each other in the x-direction. The separation structures MS may have a shape in which a width decreases toward the substrate 101 due to a high aspect ratio. In an example embodiment, the separation structures MS may include a metal material or an insulating material in the trench.

The align key structures 150 and 150' may include the first align key structure 150 penetrating the second lower stack structure GS2a in the first align structure AS1, and a second align key structure 150' penetrating the third lower stack structure GS3a in the second align structure AS2. The second align structure AS2 and the second align key structure 150' may have the same structure as that of the first align structure AS1 and the first align key structure 150, and the first align key structure 150 will be described in greater detail later.

The first align key structure 150 may penetrate the second lower stack structure GS2a in the z direction and may be in contact with the substrate 101. The first align key structure 150 may penetrate the second lower stack structure GS2a, the second horizontal conductive layer 104, and the horizontal insulating layer 110 in order and may extend into the substrate 101. However, according to an example embodiment, the first align key structure 150 may not extend into the substrate 101 and may be in contact with the upper surface of the substrate 101. The first align key structure 150 may have a shape of filling a hole, may have a columnar shape, and may have an inclined side surface towards the substrate 101 depending on an aspect ratio. The first align key structure 150 may have the same shape as that of the lower channel structure. Accordingly, the upper surface of the first align key structure 150 may be disposed at the same first level H1 as a level of the upper surface of the lower channel structure.

The first align key structure 150 may include at least one of a conductive material, silicon (Si), and/or a dielectric material. The conductive material may be, for example, titanium nitride (TiN), titanium (Ti), tungsten (W), molybdenum (Mo), ruthenium (Ru), or cobalt (Co). The dielectric may be, for example, borophosphosilicate glass (BPSG), boro-silicate glass (BSG), phospho-silicate glass (PSG), silicon carbide (SiC), silicon carbon oxide (SiCO), silicon carbon nitride (SiCN), aluminum oxide (AlO), hafnium oxide (HfO), zirconium oxide (ZrO), or titanium oxide (TiO). In an example embodiment, the first align key structure 150 may include a single material layer. The first align key structure 150 may include a material different from that of the connection insulating layer 121, and may have etch selectivity as compared to the connection insulating layer 121 under specific etching conditions. In some embodiments, the first align key structure 150 may be a monolithic layer and may have a unitary structure.

The upper surface of the first align key structure 150 may be disposed on a first level H1 higher than a second level H2 of the upper surface of the second lower stack structure GS2a. The upper surface of the first align key structure 150 may be disposed on substantially the same level as a level of the upper surface of the first lower stack structure GS1a. That is, the second level H2 of the upper surface of the second lower stack structure GS2a may be lower than the first level H1 of the upper surface of the first align key structure 150 and the first level H1 of the upper surface of the first lower stack structure GS1a. In some embodiments, the first align key structure 150 may protrude upward beyond the uppermost one of the upper sacrificial insulating layers 118b as illustrated in FIG. 4.

The second upper stack structure GS2b may be disposed on the second lower stack structure GS2a and the first align key structure 150. Accordingly, the second upper stack structure GS2b may be in contact with the first align key structure 150. The lowermost interlayer insulating layer 120b1 of the second upper stack structure GS2b may cover the upper surface and at least a portion of the side surface of the first align key structure 150. The upper interlayer insulating layers 120b and the upper sacrificial insulating layers 118b of the second upper stack structure GS2b may include a first align key region AKR1 having an outwardly curved shape, curved in a direction perpendicular from the surface of the substrate 101, on the first align key structure 150. That is, as the first align key structure 150 forms a step difference from the second lower stack structure GS2a due to a difference in heights, the second upper stack structure GS2b formed in a subsequent process may have the first align key region AKR1 having the outwardly curved shape. The degree of the curvature of the first align key region AKR1 and the shape of the first align key region AKR1 may be varied in example embodiments. In an example embodiment, the degree of the curvature of the first align key regions AKR1 of each of the upper sacrificial insulating layers 118b and the upper interlayer insulating layers 120b may be the same, but an example embodiment thereof is not limited thereto. For example, in each of the upper sacrificial insulating layers 118b and the upper interlayer insulating layers 120b, the degree of the curvature of the first align key regions AKR1 may decrease in a direction of being further away from the substrate 101. In some embodiments, the first align key regions AKR1 may include portions of the upper sacrificial insulating layers 118b slanted with respect to the upper surface of the substrate 101 as illustrated in FIG. 4. In some embodiments, the first align key regions AKR1 may include two portions of each of the upper sacrificial insulating layers 118b converging in a direction away from the substrate 101 as illustrated in FIG. 4. In some embodiments, the first align key regions AKR1 may overlap the first align key structure 150 in the Z direction. As used herein, "an element A overlapping an element B in a direction X" (or similar language) means that there is at least one line that extends in the direction X and intersects both the elements A and B.

The upper surface of the second upper stack structure GS2b on the first align key structure 150 may be disposed on a level higher than a level of the upper surface of the second upper stack structure GS2b on the second lower stack structure GS2a. The upper surface of the second upper stack structure GS2b on the first align key structure 150 may be disposed on the same level as the level of the upper surface of the first upper stack structure GS1b, and the upper surface of the second upper stack structure GS2b on the second lower stack structure GS2a may be disposed on a level lower than a level of the upper surface of the first upper stack structure GS1b.

The first align key structure 150 may allow the second upper stack structure GS2b to have the first align key region AKR1 such that issues in alignment of a photomask for forming the upper channel structure may be addressed. That is, by aligning the photomask using the first align key region AKR1, the upper channel structure may be formed on the lower channel structure having a fine width.

The upper insulating layer 180 may be disposed to cover the gate electrodes 130a and 130b, the sacrificial insulating layers 118a and 118b, and the channel structures CR The upper insulating layer 180 may include a plurality of insulating layers in example embodiments. The upper insulating layer 180 may be formed of an insulating material, and may include, for example, at least one of silicon oxide, silicon nitride, and silicon oxynitride.

The semiconductor device 100 may further include upper contact structures 182 and upper wirings 184. The upper contact structures 182 may penetrate the upper insulating layer 180 and may be connected to the channel structures CH. The upper contact structures 182 may include a conductive material, such as, for example, tungsten (W), copper (Cu), aluminum (Al), or the like. The upper wirings 184 may form an upper wiring structure electrically connected to the channel structures CH and the gate electrodes 130. The upper wirings 184 may include a conductive material, such as, for example, tungsten (W), copper (Cu), aluminum (Al), or the like. In an example embodiment, the upper contact structures 182 and the upper wirings 184 may include the same material, but an example embodiment thereof is not limited thereto.

Figure 5:
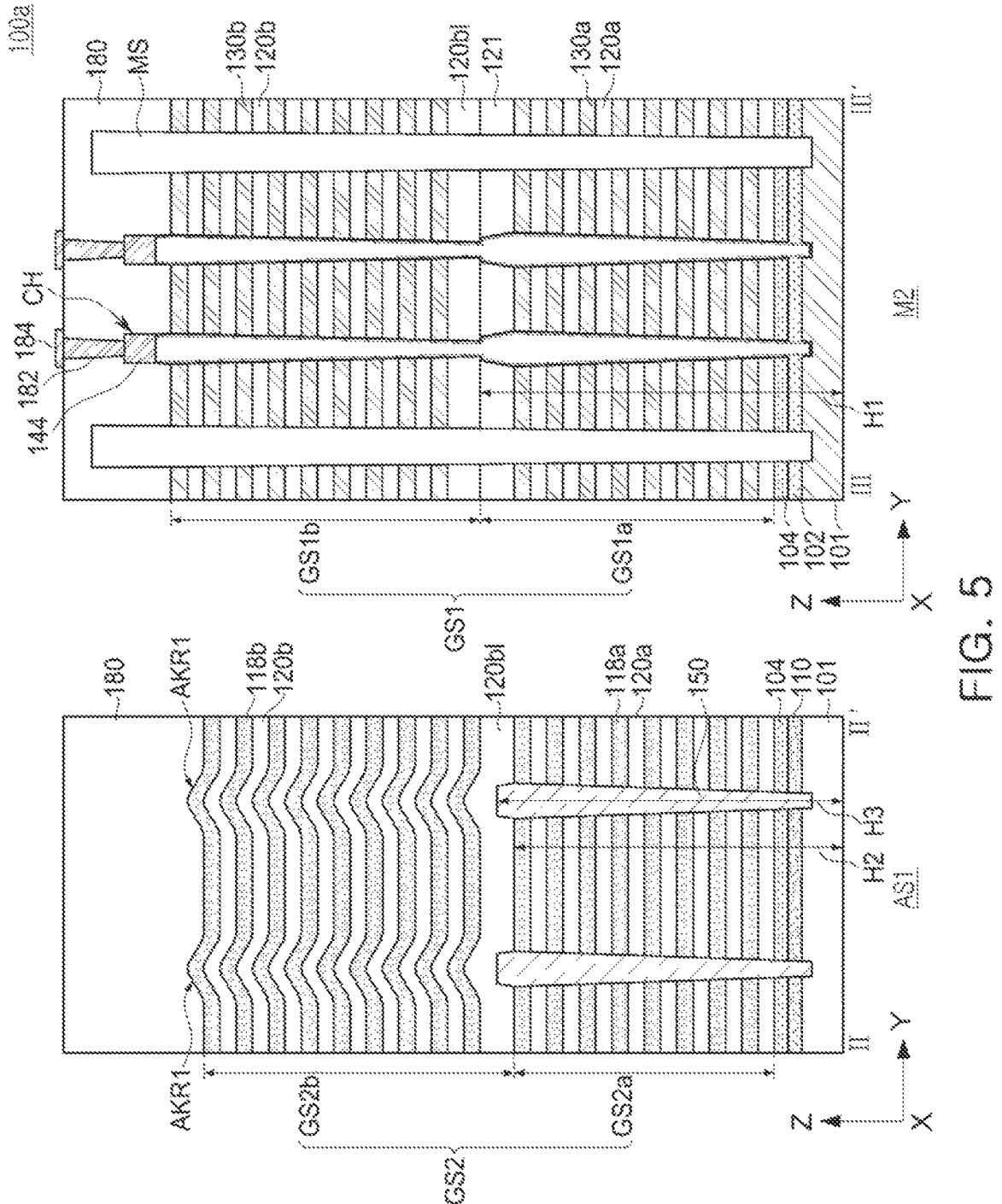
FIG. 5 is a cross-sectional diagram illustrating a semiconductor device according to an example embodiment of the present inventive concept.

FIG. 5 is a cross-sectional diagram illustrating a semiconductor device according to an example embodiment taken along lines II-II' and in FIG. 2.

Referring to FIG. 5, the semiconductor device 100a may include a structure of the first align structure AS1 different from the example illustrated in FIGS. 2 to 4.

The first align key structure 150 may penetrate the second lower stack structure GS2a in the first align structure AS1, and the second upper stack structure GS2b may be disposed on the first align key structure 150 and the second lower stack structure GS2a. However, as compared to the example illustrated in FIG. 4, the upper surface of the first align key structure 150 may be disposed on a lower level. Accordingly, the upper surface of the first align key structure 150 may be disposed on a third level H3 lower than the first level H1 of the upper surface of the lower channel structure. This structure may be formed as a portion of the first align key structure 150 is removed when the connection insulating layer 121 is removed during the manufacturing process even through the first align key structure 150 is formed a material having etch resistance higher than that of the connection insulating layer 121.

In the second upper stack structure GS2b, the outwardly curved shape of the first align key region AKR1 may be more gentle as the upper surface of the first align key structure 150 is lowered as compared to the example in FIG. 4, which may be because the difference in height between the uppermost portion and the lowermost portion of the outwardly curved shape may be caused by the difference in heights between the upper surface of the first align key structure 150 and the upper surface of the second lower stack structure GS2a. That is, as the step difference formed by the difference in heights between the first align key structure 150 and the second lower stack structure GS2a decreases, the curvature of the outwardly curved shape may increase.

The second align structure AS2 and the second align key structure 150' may have the same structure as that of the first align structure AS1 and the first align key structure 150 described above.

Figure 6:
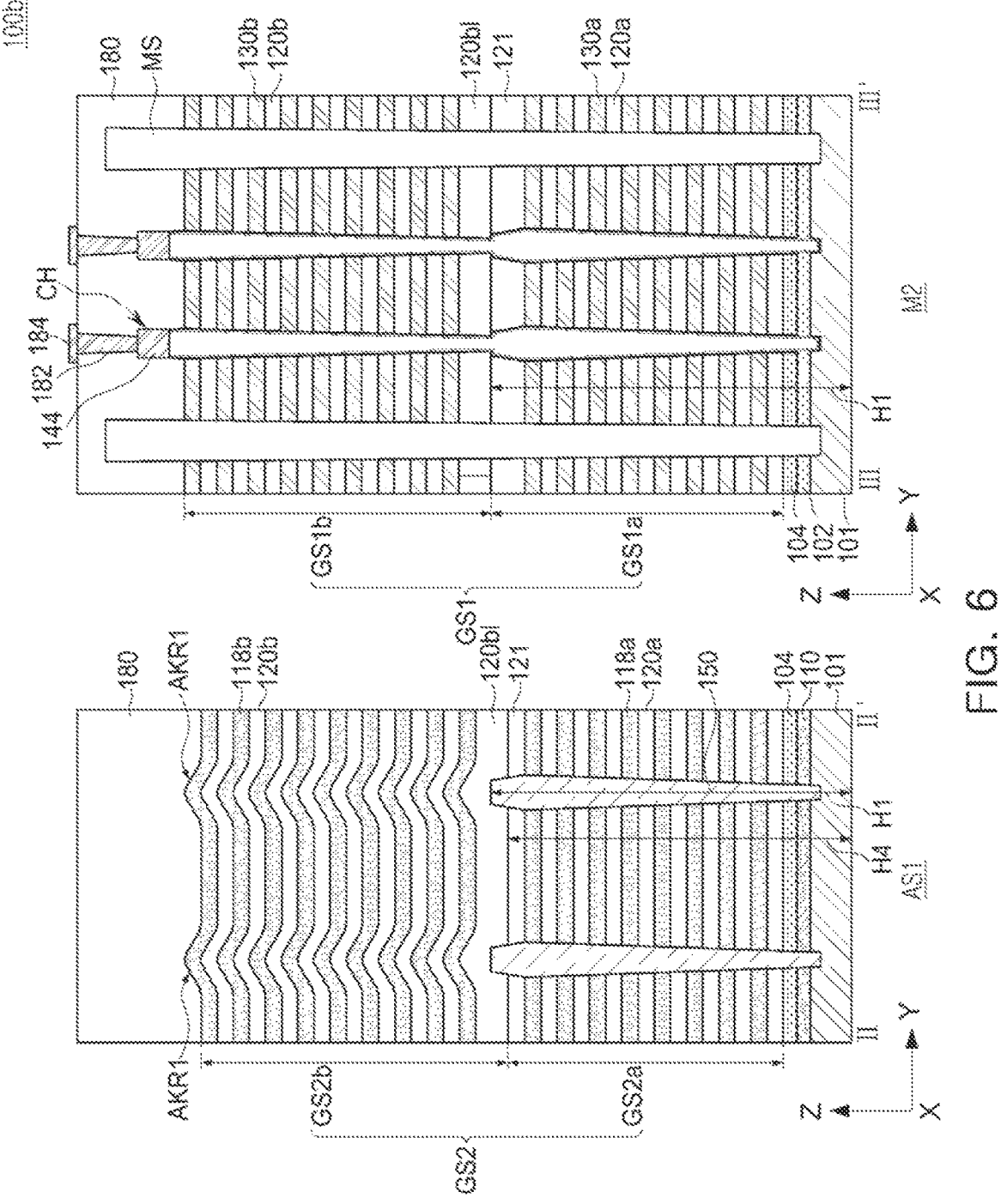
FIG. 6 is a cross-sectional diagram illustrating a semiconductor device according to an example embodiment of the present inventive concept.

FIG. 6 is a cross-sectional diagram illustrating a semiconductor device 100b according to an example embodiment taken along lines II-II' and III-III' in FIG. 2.

Referring to FIG. 6, the semiconductor device 100b may include a structure of the first align structure AS1 different from the example illustrated in FIGS. 2 to 4.

The first align key structure 150 may include the same structure as the example illustrated in FIG. 4, and accordingly, the upper surface of the first align key structure 150 may be disposed on a first level H1, substantially the same level as a level of the upper surface of the first lower stack structure GS1a and a level of the upper surface of the lower channel structure.

The second lower stack structure GS2a may further include a connection insulating layer 121, differently from the example illustrated in FIG. 4. The connection insulating layer 121 may be the layers remaining after the connection insulating layer 121 in the first align structure AS1 is removed in the process of manufacturing the semiconductor device. Accordingly, the thickness of the connection insulating layer 121 of the first align structure AS1 may be different from the thickness of the connection insulating layer 121 of each of the plurality of memory structures M1 and M2. That is, the fourth level 114 of the upper surface of the second lower stack structure GS2a may be higher than the second level H2 (see FIG. 4) by further including the connection insulating layer 121 as compared to the example in FIG. 4, and may be lower than the first level H1 of the upper surface of the lower stack structure GS1a.

In the second upper stack structure GS2b, as compared to the example in FIG. 4, as the upper surface of the second lower stack structure GS2a increases, the outwardly curved shape of the first align key region AKR1 may be more gentle. This may be because the difference in height between the uppermost portion and the lowermost portion of the outwardly curved shape is caused by a difference in heights between the upper surface of the first align key structure 150 and the upper surface of the second lower stack structure GS2a, which may be because the difference in height between the uppermost portion and the lowermost portion of the outwardly curved shape may be caused by the difference in heights between the upper surface of the first align key structure 150 and the second lower stack structure GS2a. That is, as the step difference formed by the difference in heights between the first align key structure 150 and the second lower stack structure GS2a decreases, the curvature of the outwardly curved shape may increase.

The second align structure AS2 and the second align key structure 150' may have the same structure as those of the first align structure AS1 and the first align key structure 150 described above.

Figure 7:
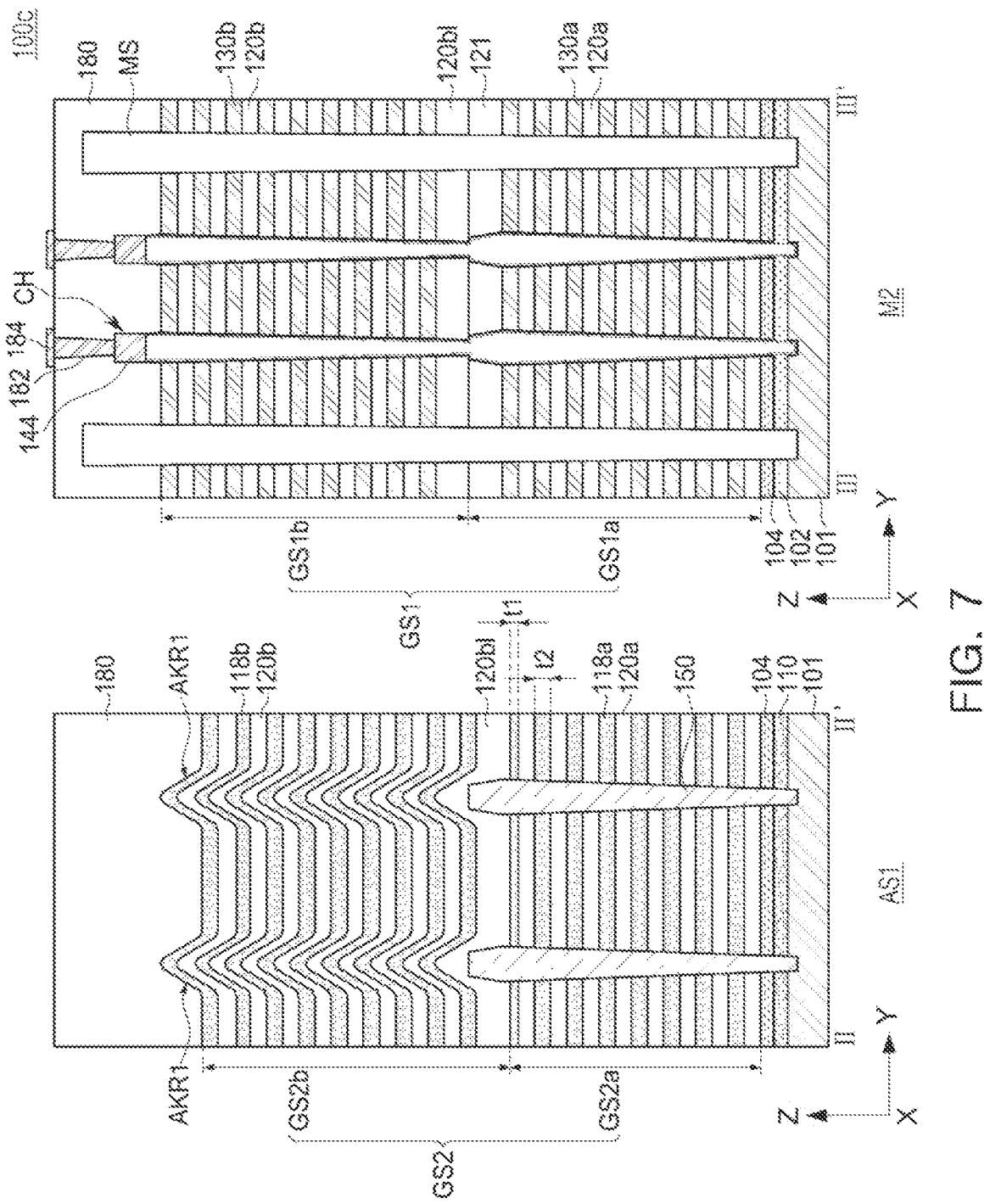
FIG. 7 is a cross-sectional diagram illustrating a semiconductor device according to an example embodiment of the present inventive concept.

FIG. 7 is a cross-sectional diagram illustrating a semiconductor device 100c according to an example embodiment taken along lines II-II' and III-III' in FIG. 2.

Referring to FIG. 7, the semiconductor device 100c may include a structure of the first align structure AS1 different from the example illustrated in FIGS. 2 to 4.

The first align key structure 150 may include the same structure as the example illustrated in FIG. 4, and accordingly, the upper surface of the first align key structure 150 may be disposed on the same level as a level of the upper surface of the first lower stack structure GS1a.

Differently from the example illustrated in FIG. 4, in the second lower stack structure GS2a, a thickness t1 of the lower sacrificial insulating layer 118a disposed on the uppermost portion may be smaller than a thickness t2 of each of the other lower sacrificial insulating layers 118a, and the difference in thicknesses may be caused by the removal of a portion of the lower sacrificial insulating layers 118a disposed on the uppermost portion by etching during the process of manufacturing the semiconductor device. The level of the upper surface of the second lower stack structure GS2a may be lower than the example in FIG. 4. The gate electrode 130a disposed on the uppermost portion of the first lower stack structure GS1a may not be etched. Accordingly, the thickness of the lower sacrificial insulating layer 118a disposed on the uppermost portion may be smaller than that of the lower gate electrode 130a disposed on the uppermost portion.

In the second upper stack structure GS2b, the outwardly curved shape of the first align key region AKR1 may be sharper as the upper surface of the second lower stack structure GS2a is lowered as compared to the example in FIG. 4. As the step difference in heights between the first align key structure 150 and the second lower stack structure GS2a increases, the curvature of the outwardly curved shape may decrease.

The second align structure AS2 and the second align key structure 150' may have the same structure as those of the first align structure AS1 and the first align key structure 150 described above.

Figure 8:
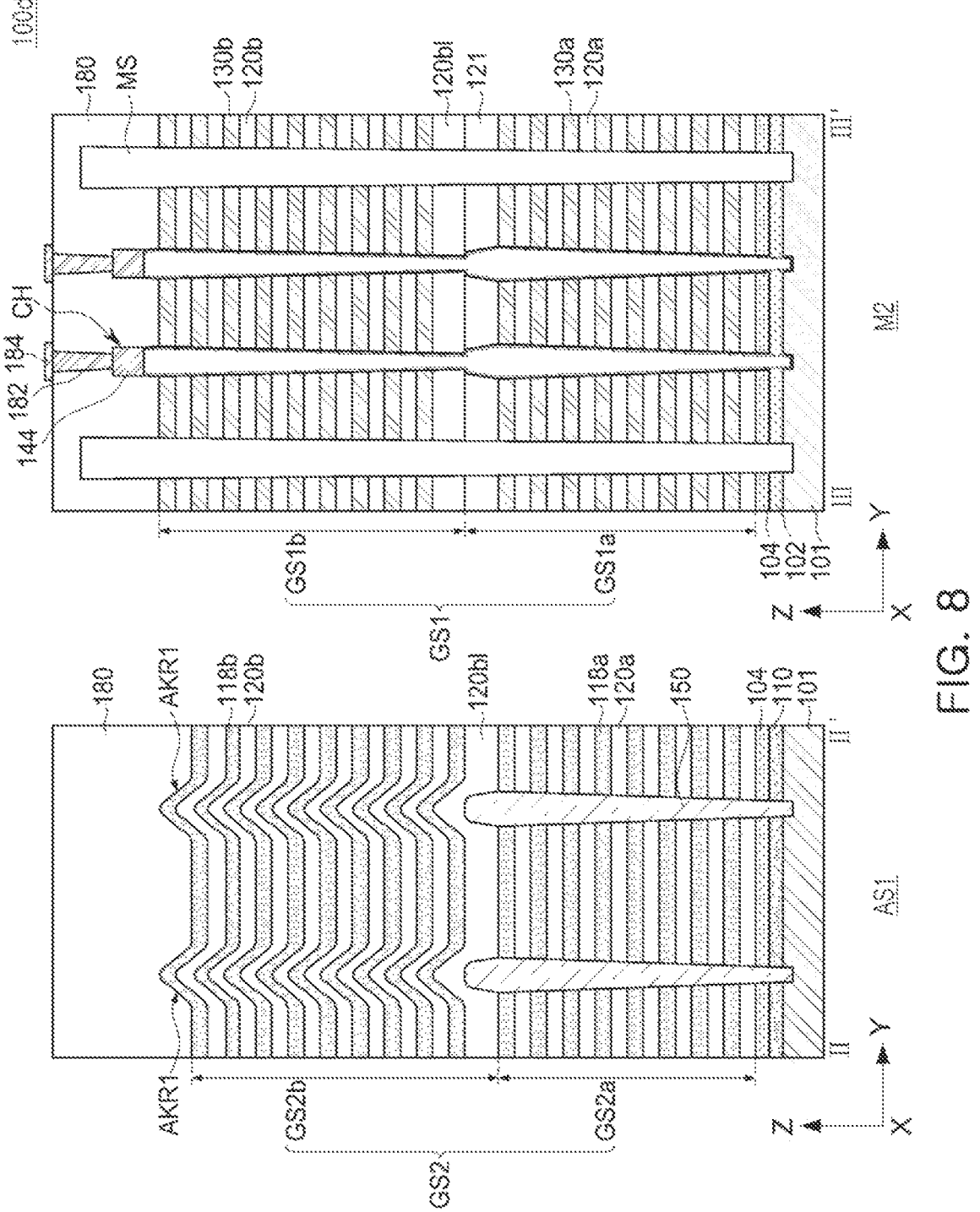
FIG. 8 is a cross-sectional diagram illustrating a semiconductor device according to an example embodiment of the present inventive concept.

FIG. 8 is a cross-sectional diagram illustrating a semiconductor device 100d according to an example embodiment taken along lines in FIG. 2.

Referring to FIG. 8, the semiconductor device 100d may include a structure of the first align key structure 150 different from the example illustrated in FIG. 4.

The first align key structure 150 may include a rounded shape rather than an angular shape on the boundary between the upper surface and the side surface, which may be a structure remaining after the lowermost edge portion having the lowest etch resistance is etched and removed during the process of manufacturing the semiconductor device.

Figure 9:
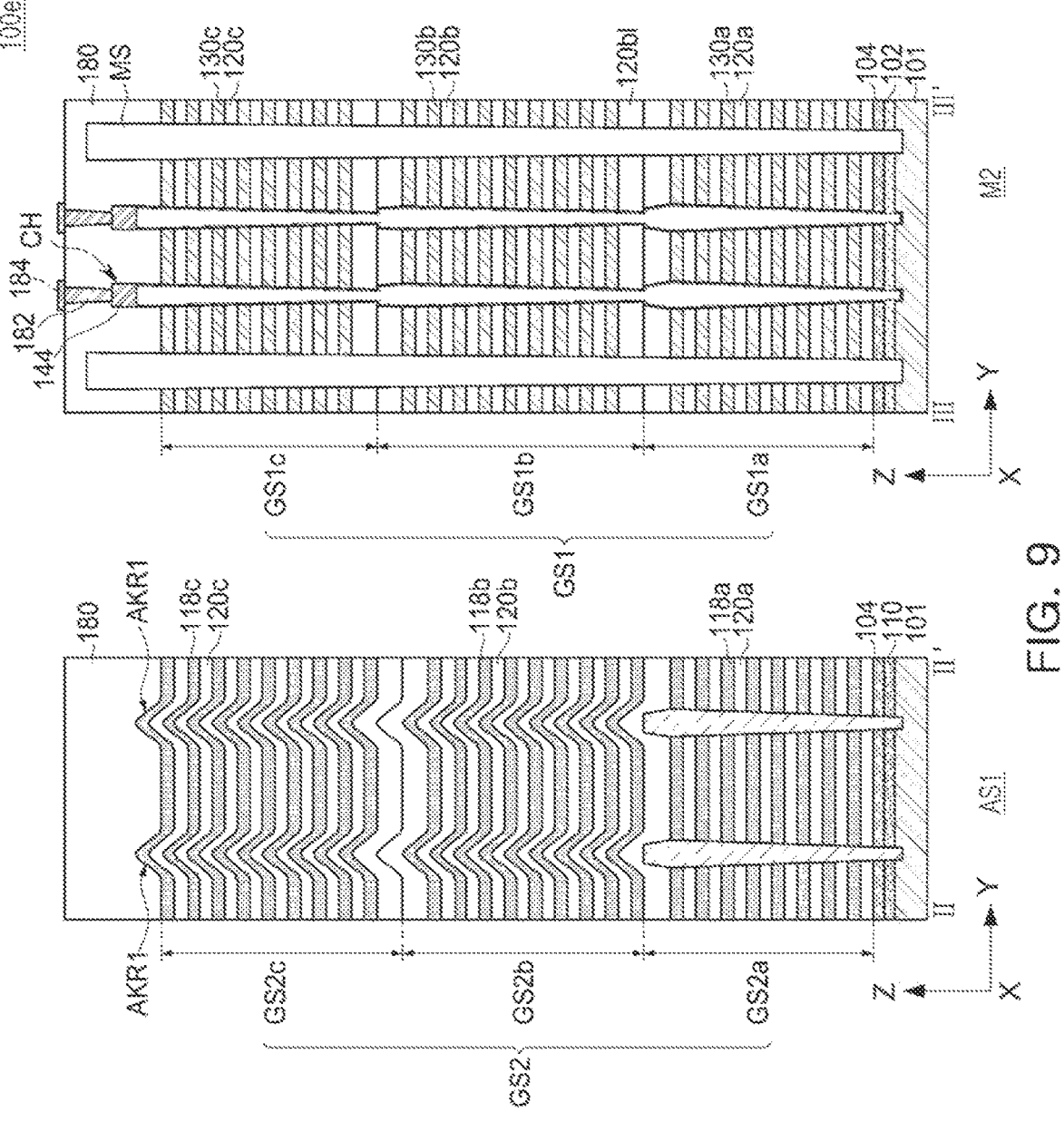
FIG. 9 is a cross-sectional diagram illustrating a semiconductor device according to an example embodiment of the present inventive concept.

FIG. 9 is a cross-sectional diagram illustrating a semiconductor device 1100e according to an example embodiment taken along lines II-II'-III-III' and in FIG. 2.

Referring to FIG. 9, the semiconductor device 100e may have structures of the first align structure AS1 and a plurality of memory structures M1 and M2 different from the examples illustrated in FIG. 4.

The first stack structure GS1 may include a first lower stack structure GS1a, a first intermediate stack structure GS2b, and a first upper stack structure GS2c. That is, differently from FIG. 4 the semiconductor device 100e may have a three-layer stack structure instead of a two-layer stack structure. However, the number of the stacked structures is not limited thereto, and three or more structure may be stacked in example embodiments.

The second stack structure GS2 may include a second lower stack structure GS2a, a second intermediate stack structure GS2b, and a second upper stack structure GS2c. The second lower stack structure GS2a and the second intermediate stack structure GS2b may have the same structures as those of the second lower stack structure and the second upper stack structure described with reference to FIG. 4, and the second upper stack structure GS2c may be stacked on the second intermediate stack structure GS2b while including the outwardly curved shape of the second intermediate stack structure GS2b. Accordingly, even in a structure in which the number of stack structures is three or more, the issues in alignment of the photomask may be addressed using the outwardly curved shape.

Figure 10:
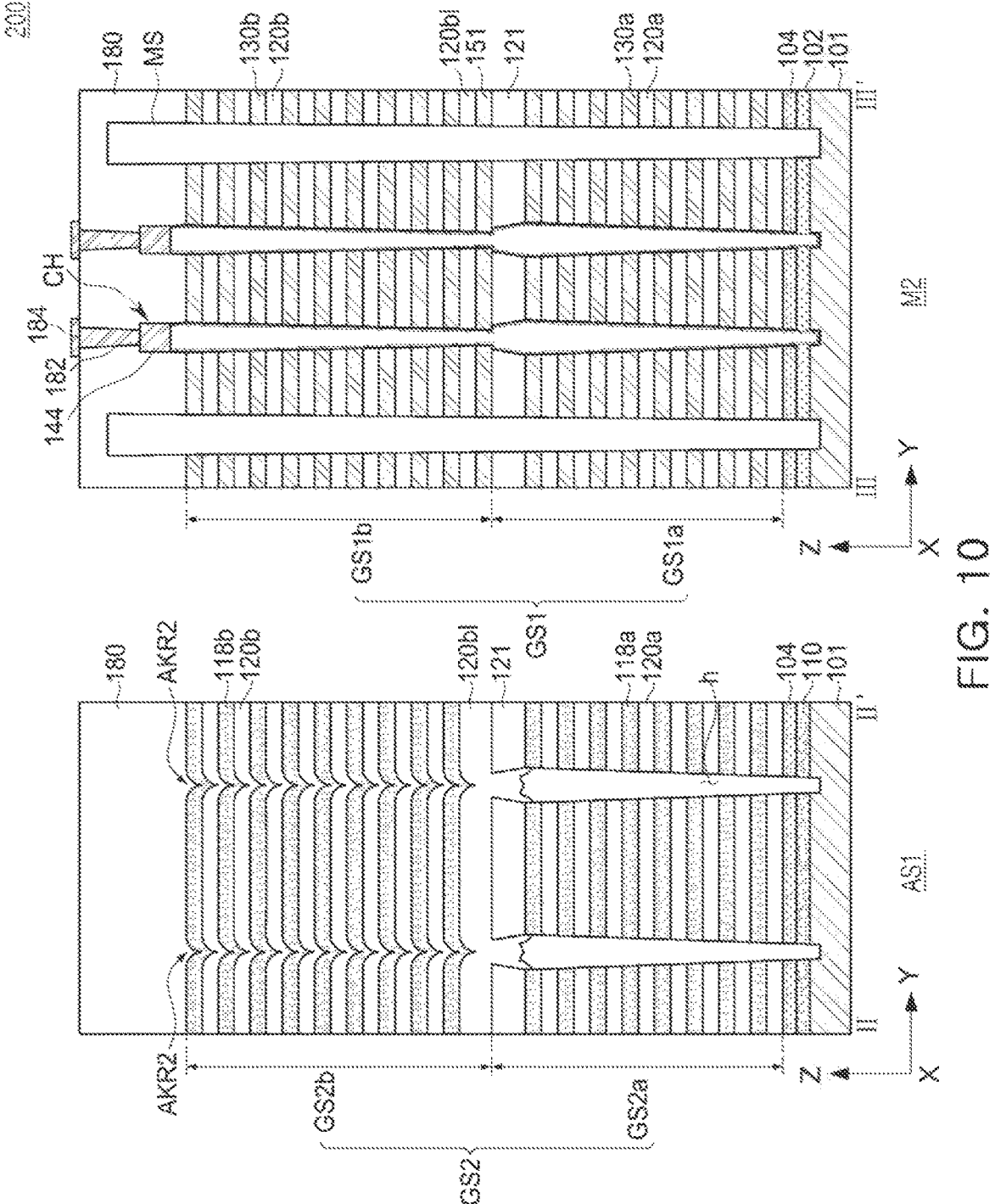
FIG. 10 is a cross-sectional diagram illustrating a semiconductor device according to an example embodiment of the present inventive concept.

FIG. 10 is a cross-sectional diagram illustrating a semiconductor device 200 according to an example embodiment taken along lines II-II' and III-III' in FIG. 2.

Referring to FIG. 10, the semiconductor device 200 may include a plurality of memory structures M1 and M2 and a first align structure AS1 different from the examples illustrated in FIG. 4.

Each of the plurality of memory structures M1 and M2 may include a first upper stack structure GS1b different from the example in FIG. 4. The first upper stack structure GS1b may further include a capping layer 151 on the first lower stack structure. The upper interlayer insulating layers 120b and the upper gate electrodes 130b may be alternately stacked on the capping layer 151. In an example embodiment, the capping layer 151 may have the same thickness as the thickness of each of the upper gate electrodes 130b or each of the upper interlayer insulating layers 120b, but an example embodiment thereof is not limited thereto. The capping layer 151 may have a thickness different from that of the gate electrodes 130b. For example, the capping layer 151 may have a thickness in the range of about 10 nm to about 30 nm. The capping layer 151 may include a conductive material and may include the same material as that of the upper gate electrodes 130b. The capping layer 151 may be formed by replacing the insulating material 151' (see FIG. 18A) which may reduce or prevent removal of the sacrificial structure VS1 (see FIG. 18A) in a region corresponding to the lower channel structure with a conductive material in a subsequent process.

The first align structure AS1 may include a second lower stack structure GS2a including a connection insulating layer 121, a second upper stack structure GS2b on the second lower stack structure GS2a, and a hole h penetrating the lower stack structure GS2a as the first align key structure.

The connection insulating layer 121 of the second lower stack structure GS2a may have an upper surface disposed on the same level as a level of the upper surface of the connection insulating layer 121 of the first lower stack structure GS1a.

The hole h may be configured as a gap (e.g., an air gap) region having a shape of penetrating the connection insulating layer 121, the lower sacrificial insulating layers 118a, and the lower interlayer insulating layers 120a of the second lower stack structure GS2a in order and extending to the substrate 101. The hole h may have a columnar shape, and may have an inclined side surface of which a width decreases towards the substrate 101 depending on an aspect ratio. The hole h may have the same shape as the shape of the first align key structure 150 or the shape of the lower channel structure in FIG. 4.

The second upper stack structure GS2b may be disposed on the second lower stack structure GS2a and the hole h. In an example embodiment, the lowermost upper interlayer insulating layer 120b1 disposed in the lowermost portion of the second upper stack structure GS2b may extend into the hole h and may cover an upper end of the side surface of the hole h. Accordingly, the lowermost upper interlayer insulating layer 120b1 disposed in the lowermost portion may cover the upper surface and at least a portion of the side surface of the connection insulating layer 121. In an example embodiment, the lowermost upper interlayer insulating layer 120b1 may have a shape in which a portion extending along the side surface of the hole h may have a thickness greater than a thickness of the portion in the central portion of the hole h, but the shape covering the hole h may be varied. The lowermost upper interlayer insulating layer 120b1 may have an upper surface disposed on a predetermined level on the connection insulating layer 121 and a lower surface disposed on a level lower than the predetermined level on the hole h. That is, the lowermost upper interlayer insulating layer 120*b*1 may include the second align key region AKR2 having an inwardly curved shape on the hole h. Accordingly, the second upper stack structure GS2*b* may have the inwardly curved shape in which upper sacrificial insulating layers 118*b* and upper interlayer insulating layers 120*b* are stacked, and each of the upper sacrificial insulating layers 118*b* and upper interlayer insulating layers 120*b* may include a second align key region AKR2 having an inwardly curved shape. The degree of the curvature of the second align key region AKR2 and the shape of the second align key region AKR2 may be varied in example embodiments. In an example embodiment, the degree of the curvature of the second align key region AKR2 of each of the upper sacrificial insulating layers 118*b* and the upper interlayer insulating layers 120*b* may be the same, but an example embodiment thereof is not limited thereto. In some embodiments, the second align key region AKR2 may include portions of the upper sacrificial insulating layers 118*b* slanted with respect to the upper surface of the substrate 101 as illustrated in FIG. 10. In some embodiments, the second align key region AKR2 may include two portions of each of the upper sacrificial insulating layers 118*b* converging in a direction toward the substrate 101 as illustrated in FIG. 4.

The hole h may allow the second upper stack structure GS2*b* to have the second align key region AKR2, thereby addressing the issue in alignment of photomask for forming the upper channel structure. That is, by aligning the photomask using the second align key region AKR2, the upper channel structure may be formed on the lower channel structure having a fine width.

In an example embodiment, in the semiconductor device 200, as described with reference to FIG. 7, the thickness of the uppermost lower sacrificial insulating layer 118*a* may be smaller than the thickness of each of the other lower sacrificial insulating layers 118*a*.

In an example embodiment, as described with reference to FIG. 9, the semiconductor device 200 may include a first stack structure GS1 and a second stack structure GS2 having three or more stack structures.

The second align structure AS2 may have the same structure as the first align structure AS1.

Figure 11:
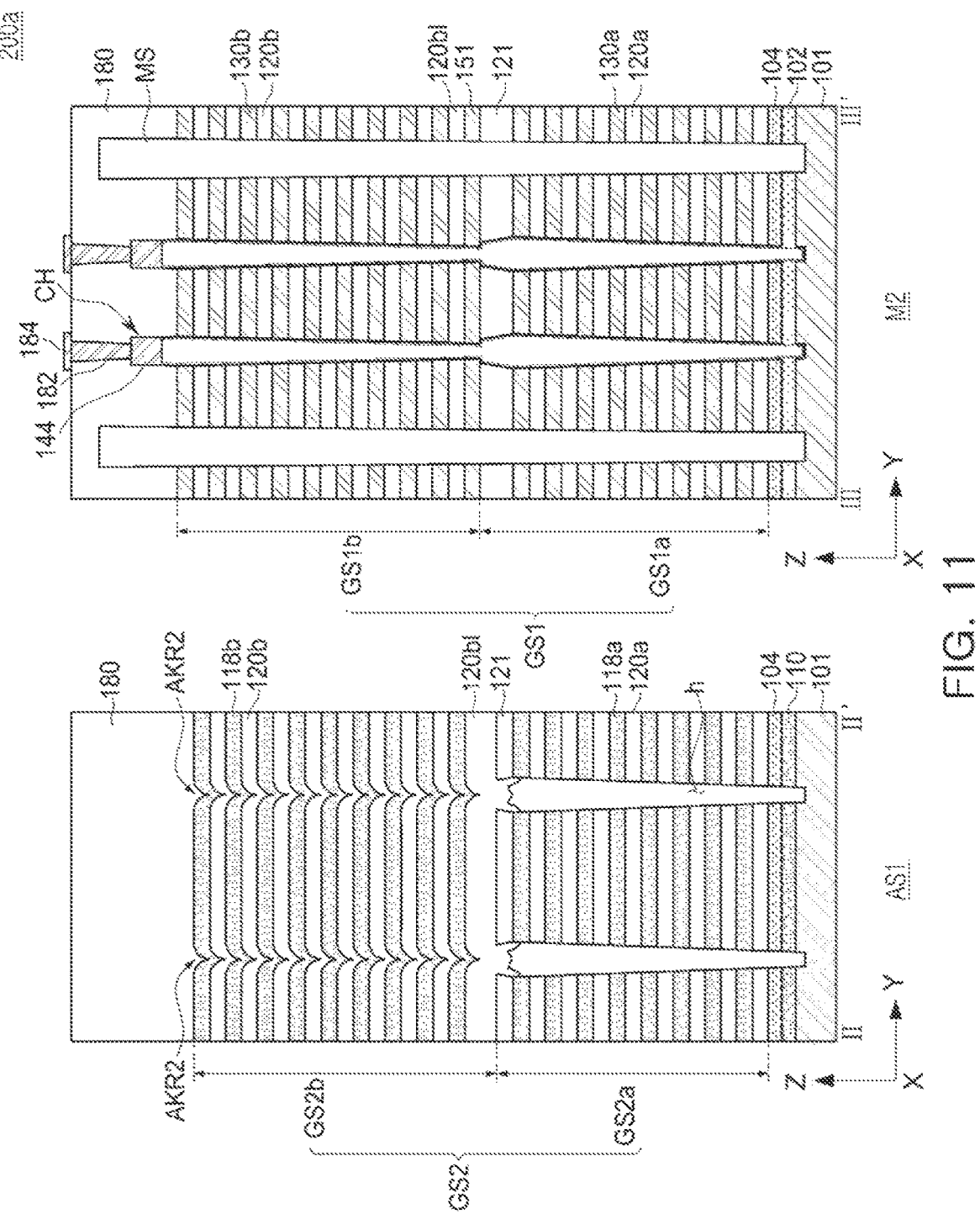
FIG. 11 is a cross-sectional diagram illustrating a semiconductor device according to an example embodiment of the present inventive concept.

FIG. 11 is a cross-sectional diagram illustrating a semiconductor device 200*a* according to an example embodiment taken along lines in FIG. 2.

Referring to FIG. 11, the semiconductor device 200*a* may include a first align structure AS1 different from the example illustrated in FIG. 10.

The second lower stack structure GS2*a* may have a structure in which the thickness of the connection insulating layer 121 may have a thickness less than a thickness of the connection insulating layer 121 illustrated in FIG. 10. Accordingly, the thickness of the connection insulating layer 121 of the second lower stack structure GS2*a* may be smaller than the thickness of the connection insulating layer 121 of the first lower stack structure GS1*a*.

The second align structure AS2 may have the same structure as the first align structure AS1.

Figure 12:
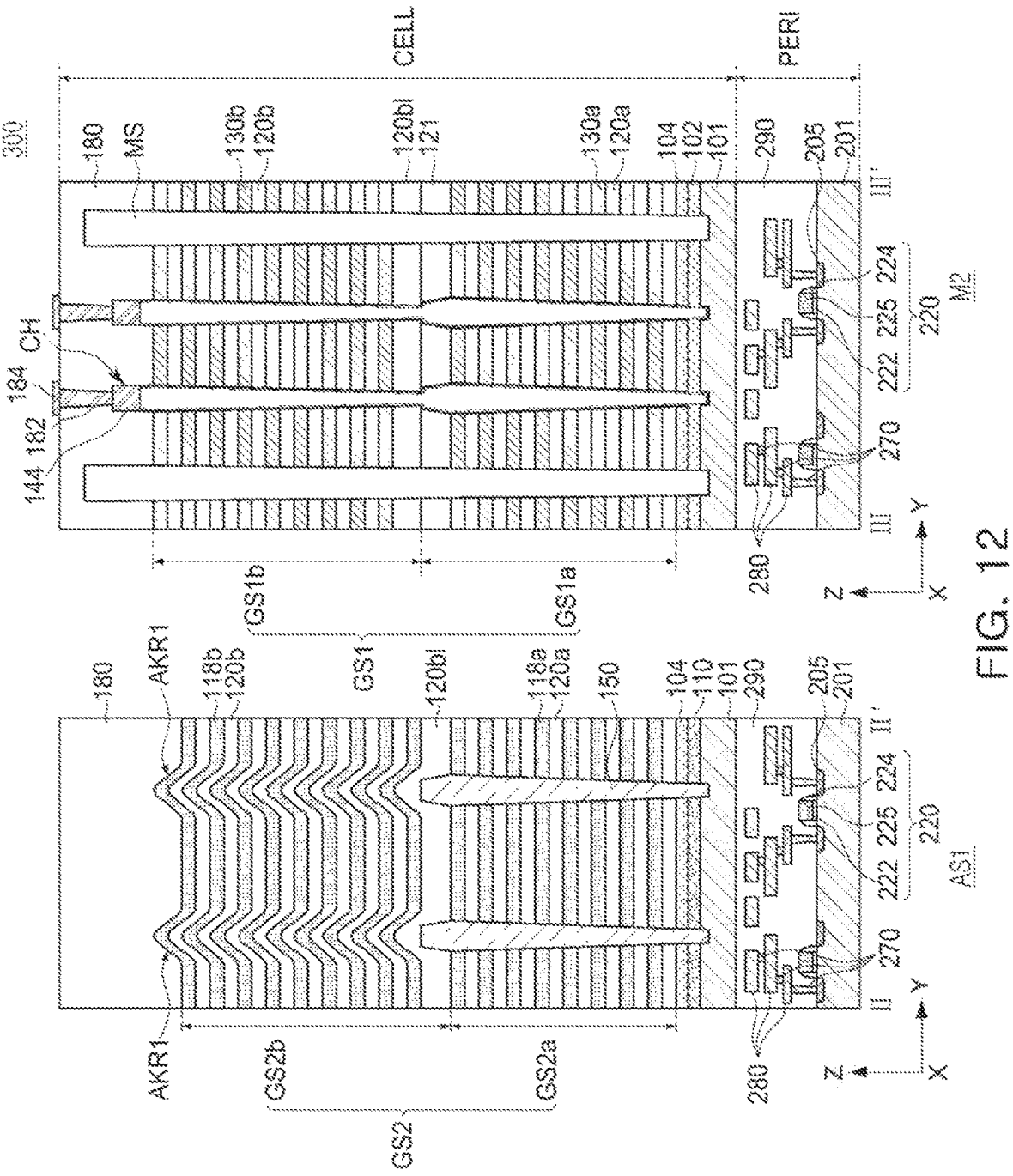
FIG. 12 is a cross-sectional diagram illustrating; a semiconductor device according to an example embodiment of the present inventive concept.

FIG. 12 is a cross-sectional diagram illustrating a semiconductor device according to an example embodiment taken along lines II-II' and III-III' in FIG. 2.

Referring to FIG. 12, the semiconductor device 300 may include a memory cell region CELL and a peripheral circuit region PERI stacked vertically. The memory cell region CELL may be disposed on an upper end of the peripheral circuit region PERI. For example, in the semiconductor device 100 in FIG. 4, the peripheral circuit region PERI may be disposed on the substrate 101 in the region not illustrated, or as in the semiconductor device 300 in the example embodiment, peripheral circuit region PERI may be disposed in a lower portion. In example embodiments, the cell region CELL may be disposed on a lower end of the peripheral circuit region PERI. The descriptions with reference to FIGS. 1 to 11 may be applied to the descriptions of the memory cell region CELL.

The peripheral circuit region PERI may include a base substrate 201, circuit devices 220 disposed on the base substrate 201, circuit contact plugs 270, and circuit wiring lines 280.

The base substrate 201 may have an upper surface extending in the x-direction and the y-direction. In the base substrate 201, separate device separation layers may be formed such that an active region may be defined. Source/drain regions 205 including impurities may be disposed in a portion of the active region. The base substrate 201 may include a semiconductor material, such as, for example, a group IV semiconductor, a group III-V compound semiconductor, or a group II-VI compound semiconductor. The base substrate 201 may be provided as a bulk wafer or an epitaxial layer. In the example embodiment, the upper substrate 101 may be provided as a polycrystalline semiconductor layer such as a polycrystalline silicon layer or an epitaxial layer.

The circuit devices 220 may include a horizontal transistor. Each of the circuit devices 220 may include a circuit gate dielectric layer 222, a spacer layer 224, and a circuit gate electrode 225. The source/drain regions 205 may be disposed in the base substrate 201 on both sides of the circuit gate electrode 225. The circuit devices 220 may be electrically connected to the gate electrodes 130*a* and 130*b* and/or the channel structures CH.

A peripheral region insulating layer 290 may be disposed on the circuit devices 220 on the base substrate 201. The circuit contact plugs 270 may penetrate the peripheral region insulating layer 290 and may be connected to the source/drain regions 205. Electrical signals may be applied to the circuit devices 220 by the circuit contact plugs 270. In a region not illustrated, circuit contact plugs 270 may also be connected to the circuit gate electrode 225. The circuit wiring lines 280 may be connected to the circuit contact plugs 270 and a plurality of the circuit wiring lines 280 may be disposed.

In the semiconductor device 300, the peripheral circuit region PERI may be manufactured, the substrate 101 of the memory cell region CELL may be formed thereon, and the memory cell region CELL may be manufactured. The substrate 101 may have the same size as that of the base substrate 201 or may have a size smaller than that of the base substrate 201. The memory cell region CELL and the peripheral circuit region PERI may be connected to each other in a region not illustrated. For example, one end of the gate electrodes 130 in the y-direction may be electrically connected to the circuit devices 220. The form in which the memory cell region CELL and the peripheral circuit region PERI are vertically stacked may also be applied to the example embodiments in FIGS. 1 to 11.

Figure 13:
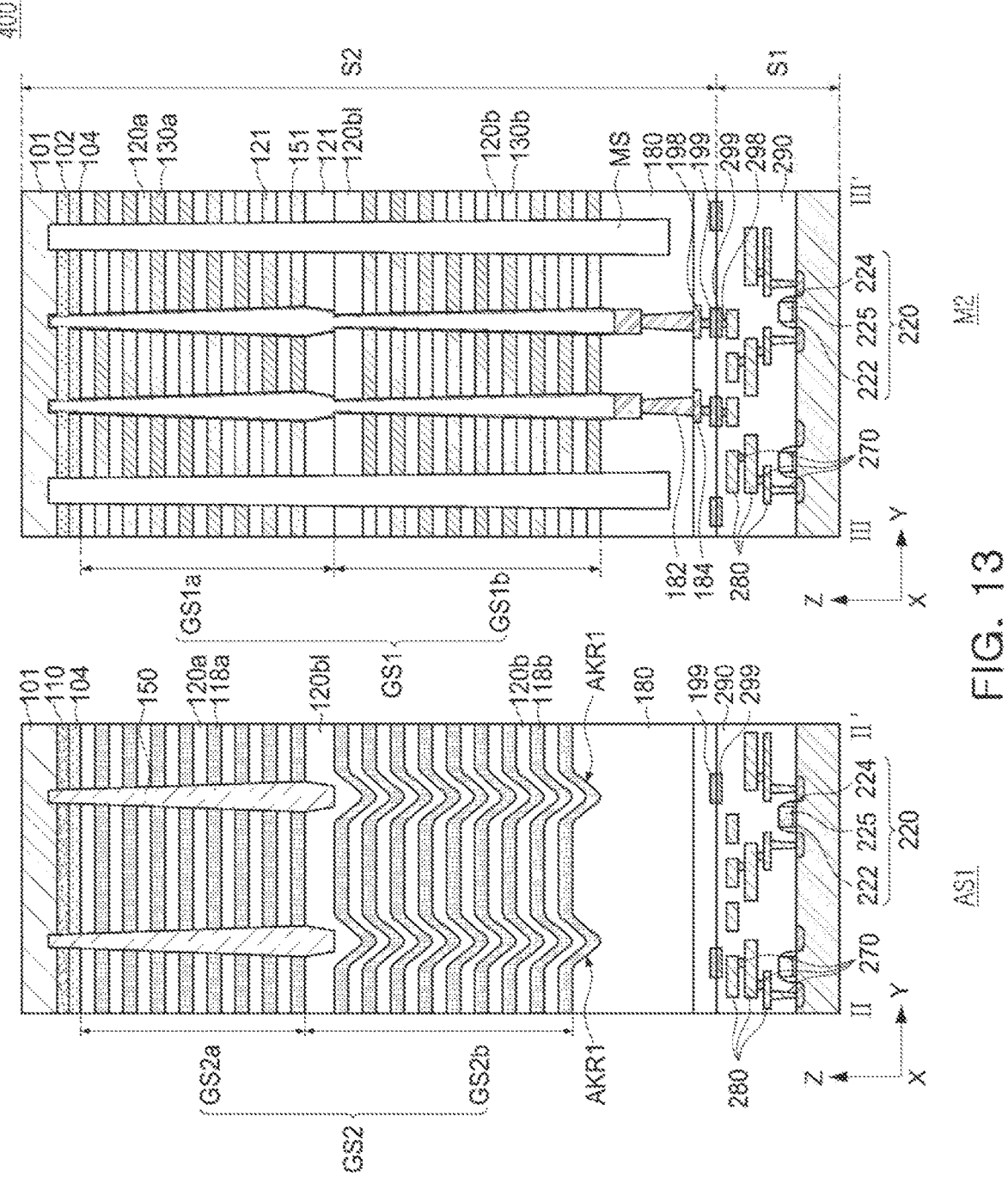
FIG. 13 is a cross-sectional diagram illustrating a semiconductor device according to an example embodiment of the present inventive concept.

FIG. 13 is a cross-sectional diagram illustrating a semiconductor device 400 according to an example embodiment taken along lines II-II' and III-III' in FIG. 2.

Referring to FIG. 13, the semiconductor device 400 may include a first structure S1 and a second structure S2 bonded to each other by a wafer bonding method.

The description of the peripheral circuit region PERI described above with reference to FIG. 12 may be applied to the description of the first structure S1. However, the first structure S1 may further include first bonding vias 298 and first bonding pads 299 which may be bonding structures.

The first bonding vias 298 may be disposed on the uppermost circuit wiring lines 280 and may be connected to the circuit wiring lines 280. At least a portion of the first bonding pads 299 may be connected to the first bonding vias 298 on the first bonding vias 298. The first bonding pads 299 may be connected to the second bonding pads 199 of the second structure 52. The first bonding pads 299 may provide an electrical connection path according to the bonding of the first structure S1 and the second structure S2 together with the second bonding pads 199. The first bonding vias 298 and the first bonding pads 299 may include a conductive material, such as, for example, copper (Cu).

The descriptions with reference to FIGS. 1 to 11 may be applied to the description of the second structure S2, unless otherwise indicated. The second structure S2 may further include second bonding vias 198 and second bonding pads 199, which are bonding structures. The second structure S2 may further include a protective layer covering the upper surface of the substrate 101.

The second bonding vias 198 and the second bonding pads 199 may be disposed below the lowermost wiring lines. The second bonding vias 198 may be connected to the wiring lines and the second bonding pads 199, and the second bonding pads 199 may be bonded to the first bonding pads 299 of the first structure S1. The second bonding vias 198 and the second bonding pads 199 may include a conductive material, such as, for example, copper (Cu).

The first structure S1 and the second structure S2 may be bonded by copper (Cu)-copper (Cu) bonding by the first bonding pads 299 and the second bonding pads 199. Other than the copper (Cu)-copper (Cu) bonding, the first structure S1 and the second structure S2 may also be bonded by dielectric-dielectric bonding. The dielectric-dielectric bonding may be bonding by dielectric layers forming each of the peripheral region insulating layer 290 and the upper insulating layer 180 and surrounding each of the first bonding pads 299 and the second bonding pads 199. Accordingly, the first structure S1 and the second structure S2 may be bonded to each other without an adhesive layer.

Figure 14:
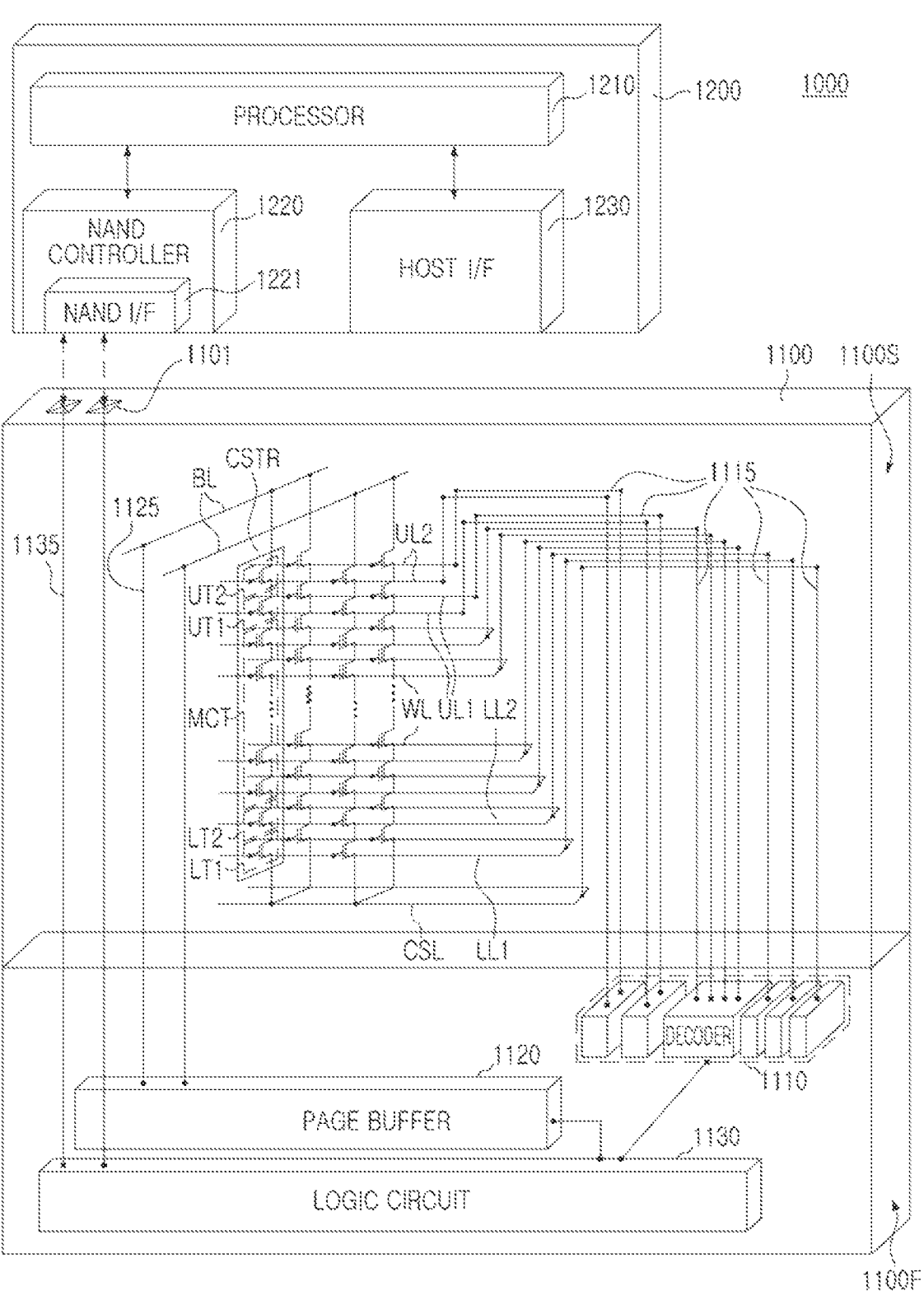
FIG. 14 is a diagram illustrating a data storage system including a semiconductor device according to an example embodiment of the present inventive concept.

FIG. 14 is a diagram illustrating a data storage system 1000 including a semiconductor device according to an example embodiment.

Referring to FIG. 14, the data storage system 1000 may include a semiconductor device 1100 and a controller 1200 electrically connected to the semiconductor device 1100. The data storage system 1000 may be a storage device including one or a plurality of semiconductor devices 1100 or an electronic device including a storage device. For example, the data storage system 1000 may be a solid state drive device (SSD) device, a universal serial bus (USB), a computing system, a medical device, or a communication device including one or a plurality of semiconductor devices 1100.

The semiconductor device 1100 may be configured as a non-volatile memory device, such as, for example, a NAND flash memory device described above with reference to FIGS. 1 to 13. The semiconductor device 1100 may include a first semiconductor structure 1100E and a second semiconductor structure 1100S on the first semiconductor structure 1100F. In example embodiments, the first semiconductor structure 1100E may be disposed adjacent to the second semiconductor structure 1100S. The first semiconductor structure 1100F may be configured as a peripheral circuit structure including a decoder circuit 1110, a page buffer 1120, and a logic circuit 1130. The second semiconductor structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second semiconductor structure 1100S, each of the memory cell strings CSTR may include the lower transistors LT1 and LT2 adjacent to the common source line CSL, upper transistors UT1 and UT2 adjacent to the bit line BL, and a plurality of memory cell transistors MCI disposed between the lower transistors LT1 and LT2 and the upper transistors UT1 and UT2. The number of the lower transistors LT1 and LT2 and the number of the upper transistors UT1 and UT2 may be varied in example embodiments.

In example embodiments, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word lines WL may be gate electrode layers of the memory cell transistors MCT, and the gate upper lines UL1 and UL2 may be gate electrodes of the upper transistors UT1 and UT2, respectively.

In example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT1 may be used for an erase operation of erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection lines 1115 extending from the first semiconductor structure 1100F to the second semiconductor structure 1100S. The bit lines BL may be electrically connected to the page buffer 1120 through second connection lines 1125 extending from the first semiconductor structure 1100E to the second semiconductor structure 1100S.

In the first semiconductor structure 1100F, the decoder circuit 1110 and the page buffer 1120 may perform a control operation on at least one of the select memory cell transistors among the plurality of memory cell transistors MCT. The decoder circuit 1110 and the page buffer 1120 may be controlled by the logic circuit 1130. The semiconductor device 1000 may communicate with the controller 1200 through the input/output pad 1101 electrically connected to the logic circuit 1130. The input/output pad 1101 may be electrically connected to the logic circuit 1130 through an input/output connection line 1135 extending from the first semiconductor structure 11001' to the second semiconductor structure 1100S.

The controller 1200 may include a processor 1210, a NAND controller 1220, and a host interface 1230. In example embodiments, the data storage system 1000 may include a plurality of semiconductor devices 1100, and in this case, the controller 1200 may control the plurality of semiconductor devices 1000.

The processor 1210 may control overall operations of the data storage system 1000 including the controller 1200. The processor 1210 may operate according to a predetermined firmware, and may access the semiconductor device 1100 by controlling the NAND controller 1220. The NAND controller 1220 may include a NAND interface 1221 configured to handle communication with the semiconductor device 1100. A control command for controlling the semiconductor device 1100, data to be written in the memory cell transistors MCT of the semiconductor device 1100, and data to be read from the memory cell transistors MCT of the semiconductor device 1100 may be transmitted through the NAND interface 1221. The host interface 1230 may provide a communication function between the data storage system 1000 and an external host. When a control command is received from an external host through the host interface 1230, the processor 1210 may control the semiconductor device 1100 in response to the control command.

Figure 15:
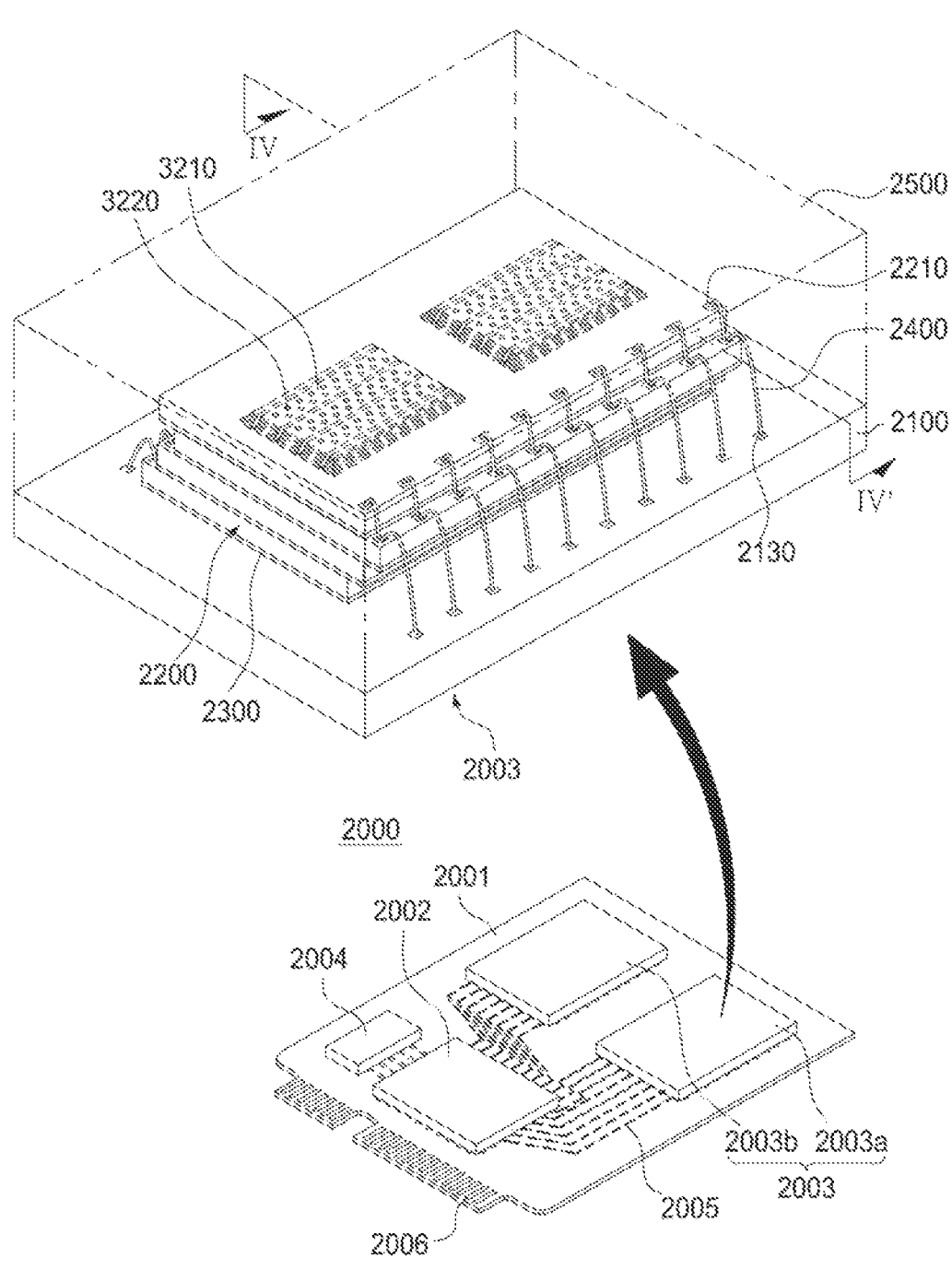
FIG. 15 is a perspective diagram illustrating a data storage system including a semiconductor device according to an example embodiment of the present inventive concept.

FIG. 15 is a perspective diagram illustrating a data storage system including a semiconductor device according to an example embodiment.

Referring to FIG. 15, a data storage system 2000 in an example embodiment may include a main substrate 2001, a controller 2002 mounted on the main substrate 2001, one or more semiconductor packages 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins coupled to an external host. The number of the plurality of pins and the arrangement of the plurality of pins in the connector 2006 may be varied according to a communication interface between the data storage system 2000 and the external host. In example embodiments, the data storage system 2000 may communicate with the external host according to one of interfaces among an M-Phy for Universal Serial Bus (USB), peripheral component interconnect express (PCI-Express), serial advanced technology attachment (SATA), universal flash storage (UFS), or the like. In example embodiments, the data storage system 2000 may be operated by power supplied from an external host through the connector 2006. The data storage system 2000 may further include a power management integrated circuit (PMIC) for distributing power supplied from the external host to the controller 2002 and the semiconductor package 2003.

The controller 2002 may write data in or may read data from the semiconductor package 2003, and may improve an operating speed of the data storage system 2000.

The DRAM 2004 may be configured as a buffer memory for mitigating a difference in speeds between the semiconductor package 2003, which is a data storage space, and an external host. The DRAM 2004 included in the data storage system 2000 may operate as a cache memory, and may provide a space for temporarily storing data in a control operation for the semiconductor package 2003. When the data storage system 2000 includes the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003*a* and 2003*b* spaced apart from each other. Each of the first and second semiconductor packages 2003*a* and 2003*b* may be configured as a semiconductor package including a plurality of semiconductor chips 2200. Each of the first and second semiconductor packages 2003*a* and 2003*b* may include a package substrate 2100, semiconductor chips 2200 on the package substrate 2100, adhesive layers 2300 disposed on lower surfaces of the semiconductor chips 2200, respectively, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including package upper pads 2130. Each semiconductor chip 2200 may include an input/output pad 2210. The input/output pad 2210 may correspond to the input/output pad 1101 in FIG. 14. Each of the semiconductor chips 2200 may include gate stack structures 3210 and channel structures 3220. Each of the semiconductor chips 2200 may include the semiconductor device described in the aforementioned example embodiment with reference to FIGS. 1 to 13.

In example embodiments, the connection structure 2400 may be configured as a bonding wire electrically connecting the input/output pad 2210 and the package upper pads 2130 to each other. Accordingly, in each of the first and second semiconductor packages 2003*a* and 2003*b*, the semiconductor chips 2200 may be electrically connected to each other by a bonding wire method, and may be electrically connected to the package upper pads 2130 of the package substrate 2100. In example embodiments, in each of the first and second semiconductor packages 2003*a* and 2003*b*, the semiconductor chips 2200 may be electrically connected to each other by a connection structure including a through silicon via (TSV), instead of the connection structure 2400 by the bonding wire method.

In example embodiments, the controller 2002 and the semiconductor chips 2200 may be included in a single package. In an example embodiment, the controller 2002 and the semiconductor chips 2200 may be mounted on an interposer substrate different from the main substrate 2001, and the controller 2002 and the semiconductor chips 2200 may be connected to each other by wiring formed on the interposer substrate.

Figure 16:
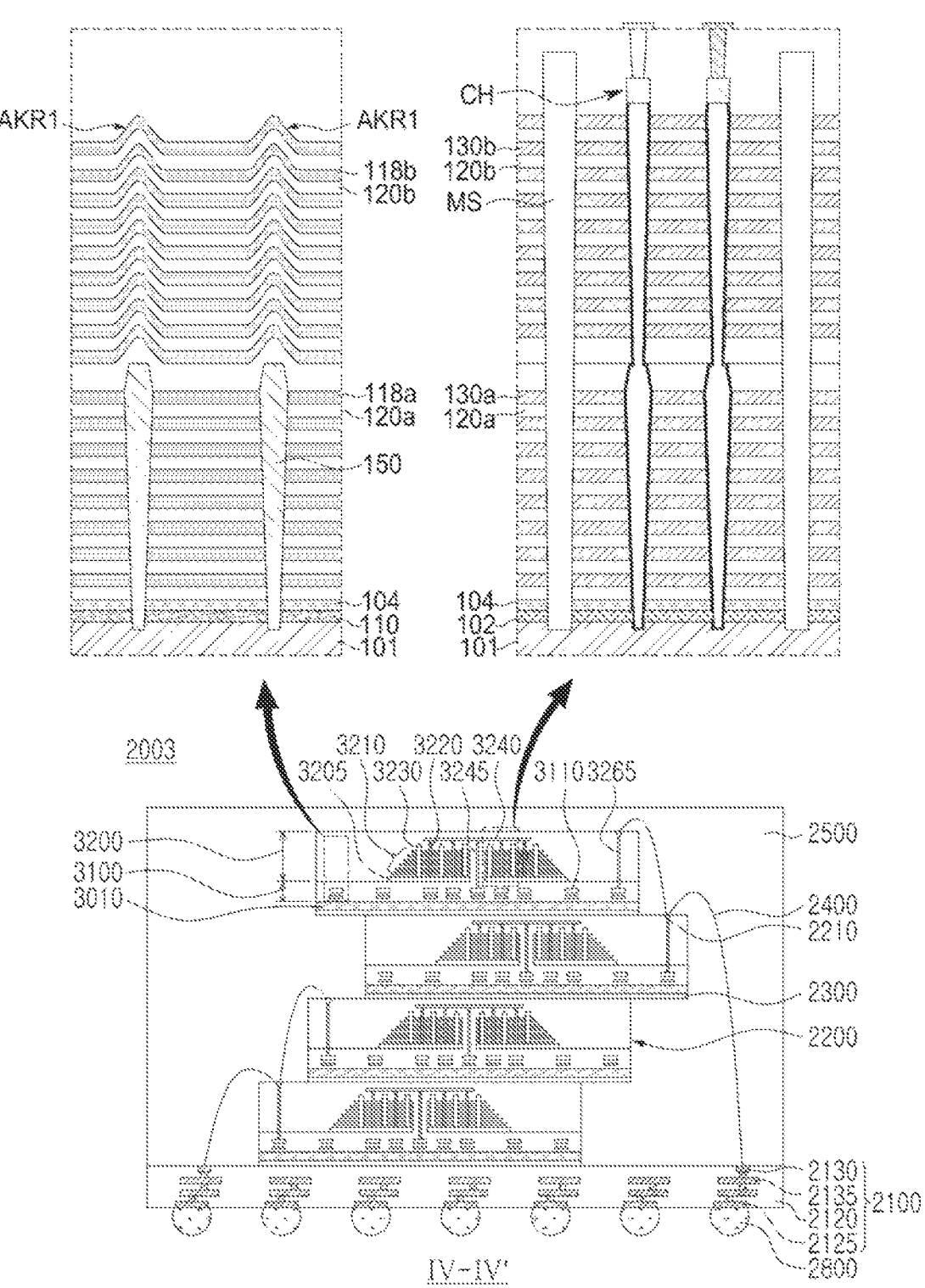
FIG. 16 is a cross-sectional diagram illustrating; a semiconductor package according to an example embodiment of the present inventive concept.

FIG. 16 is a cross-sectional diagram illustrating a semiconductor package 2003 according to an example embodiment taken along line IV-IV" in FIG. 15.

Referring to FIG. 16, in the semiconductor package 2003, the package substrate 2100 may be configured as a printed circuit board. The package substrate 2100 may include a package substrate body 2120, package upper pads 2130 (see FIG. 15) disposed on the upper surface of the package substrate body 2120, lower pads 2125 disposed on the lower surface of the package substrate body 2120 or exposed through the lower surface, and internal wirings 2135 electrically connecting the upper pads 2130 to the lower pads 2125 in the package substrate body 2120. The upper pads 2130 may be electrically connected to the connection structures 2400. The lower pads 2125 may be connected to the wiring patterns 2005 of the main substrate 2010 of the data storage system 2000 through conductive connectors 2800 as illustrated in FIG. 15.

Each of the semiconductor chips 2200 may include a semiconductor substrate 3010 and a first semiconductor structure 3100 and a second semiconductor structure 3200 stacked in order on the semiconductor substrate 3010. The first semiconductor structure 3100 may include a peripheral circuit region including peripheral wirings 3110. The second semiconductor structure 3200 may include a common source line 3205, a gate stack structure 3210 on the common source line 3205, and channel structures 3220 and separation regions 3230 penetrating the gate stack structure 3210, bit lines 3240 electrically connected to the memory channel structures 3220, and cell contact plugs 3235 electrically connected to word lines WL (see FIG. 14) of the gate stack structure 3210. In each of the semiconductor chips 2200, a first align key structure 150 penetrating the second lower stack structure GS2*a* (see FIG. 4) may be included as described in the aforementioned example embodiment with reference to FIGS. 1 to 4, and a second upper stack structure GS2*b* including a key align region AKR1 having an outwardly curved shape according to a step difference between the first align key structure 150 and the second lower stack structure GS2*a* may be further included.

Each of the semiconductor chips 2200 may include a through wire 3245 electrically connected to the peripheral wires 3110 of the first semiconductor structure 3100 and extending into the second semiconductor structure 3200. The through wiring 3245 may be disposed on an external side of the gate stack structure 3210, and may be further disposed to penetrate the gate stack structure 3210. Each of the semiconductor chips 2200 may further include an input/output pad 2210 (see FIG. 15) electrically connected to the peripheral wirings 3110 of the first semiconductor structure 3100.

FIGS. 17A to 17L are cross-sectional diagrams illustrating a method of manufacturing a semiconductor device 100 according to an example embodiment, illustrating regions corresponding to FIG. 4.

Figure 17A:
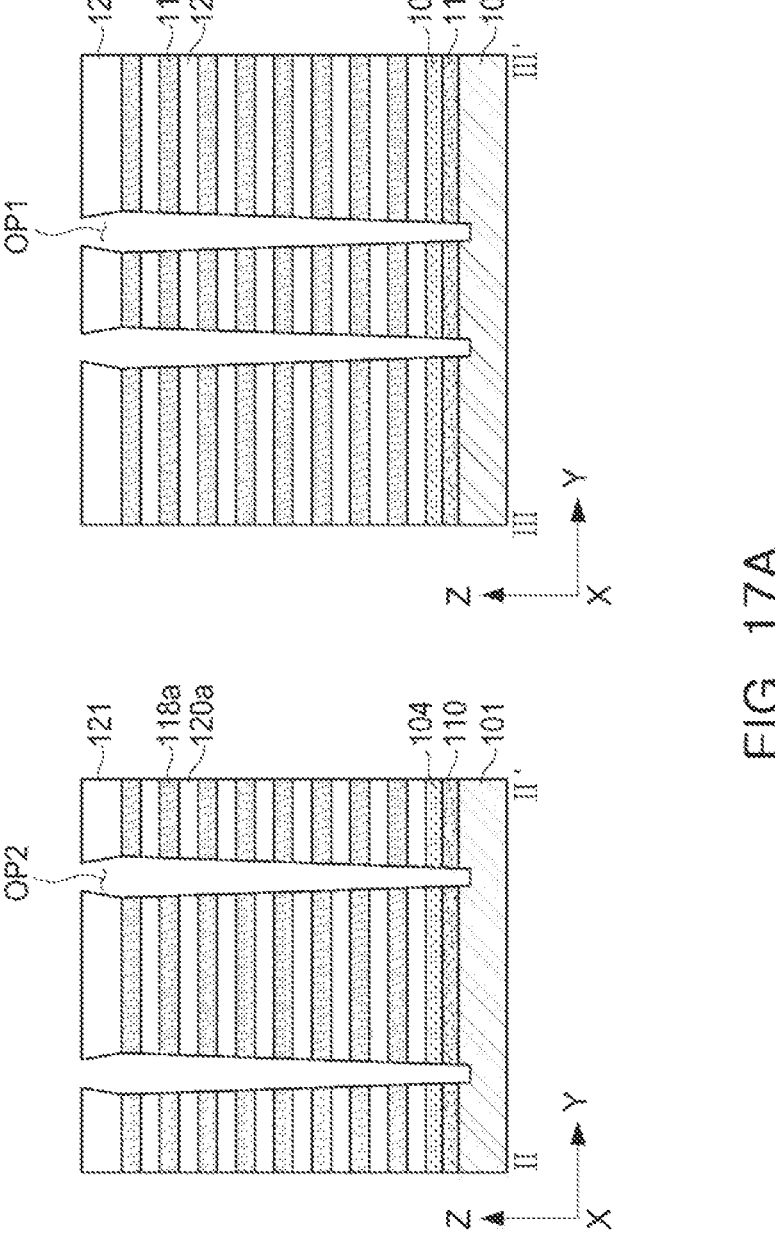
FIGS. 17A to 17L are cross-sectional diagrams illustrating a method of manufacturing a semiconductor device according to an example embodiment of the present inventive concept.

Referring to FIG. 17A, a horizontal insulating layer 110 and a second horizontal conductive layer 104 may be formed in order on a substrate 101, and lower sacrificial insulating layers 118*a* and lower interlayer insulating layers 120*a* may be stacked alternately.

The horizontal insulating layer 110 may include first to third horizontal insulating layers, and the first horizontal insulating layer and the third horizontal insulating layer may include the same material. The first horizontal insulating layer and the second horizontal insulating layer may include different materials. For example, the first horizontal insulating layer and the third horizontal insulating layer may be formed of the same material as that of the lower interlayer insulating layers 120*a*, and the second horizontal insulating layer may be formed of the same material as that of the lower sacrificial insulating layers 118*a*. The horizontal insulating layer 110 may be partially replaced by the first horizontal conductive layer 102 (see FIG. 4) through a subsequent process.

The lower sacrificial insulating layers 118*a* may be partially replaced with lower gate electrodes 130*a* (see FIG. 4) through a subsequent process. The lower sacrificial insulating layers 118*a* may be formed of a material different from that of the lower interlayer insulating layers 120*a*, and may be formed of a material etched with etch selectivity with respect to the lower interlayer insulating layers 120*a* under specific etching conditions. For example, the lower interlayer insulating layers 120*a* may be formed of at least one of silicon oxide and silicon nitride, and the lower sacrificial insulating layers 118*a* may be formed of a material different from that of the lower interlayer insulating layers 120*a*, selected from among silicon, silicon oxide, silicon carbide, and silicon nitride. In example embodiments, the thicknesses of the lower interlayer insulating layers 120*a* may not be the same. The thickness of the lower interlayer insulating layers 120*a* and the lower sacrificial insulating layers 118*a* and the number of the layers included therein may be varied from the illustrated examples.

Thereafter, a connection insulating layer 121 may be formed on the alternately stacked lower sacrificial insulating layers 118*a* and lower interlayer insulating layers 120*a*. The connection insulating layer 121 may include, for example, the same material as that of the lower interlayer insulating layers 120*a*.

Thereafter, openings OP1 and OP2 penetrating the connection insulating layer 121, the lower sacrificial insulating layers 118*a*, the second horizontal conductive layer 104, and the horizontal insulating layer 110 in order and extending into the substrate 101 may be formed. The first and second openings OP1 and OP2 may extend into the substrate 101 and may form recesses or alternatively, the first and second openings OP1 and OP2 may extend to the upper surface of the substrate 101 and may not form the recesses. The first and second openings OP1 and OP2 may have a columnar shape having a hole shape, and may include inclined side surfaces. The first opening OP1 may be formed in a region in which the plurality of memory structures M1 and M2 (see FIG. 2) are formed in a subsequent process, and the second opening OP2 may be formed in a region in which the first align structure AS1 (see FIG. 2) is formed in a subsequent process.

Figure 17B:
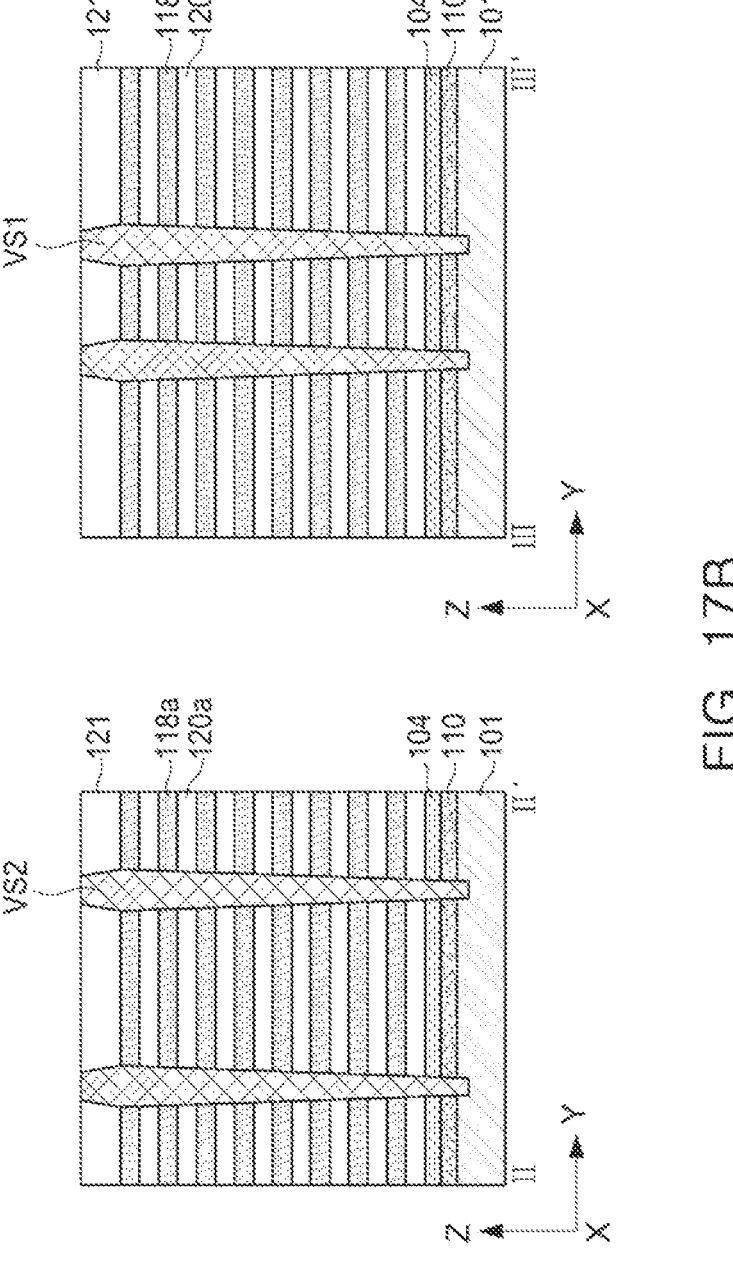

Referring to FIG. 17B, first and second vertical structures VS1 and VS2 may be formed in the first and second openings OP1 and OP2.

The first and second vertical structures VS1 and VS2 may be formed by filling the first and second openings OP1 and OP2 with a sacrificial film material, and removing a portion of the sacrificial film material covering the upper surface of the connection insulating layer 121 by a chemical mechanical polishing (CMP) process. The sacrificial layer material may include at least one of polycrystalline silicon, tungsten (W), or carbon (C). In an example embodiment, the sacrificial layer material may be a single material layer including carbon (C).

Figure 17C:
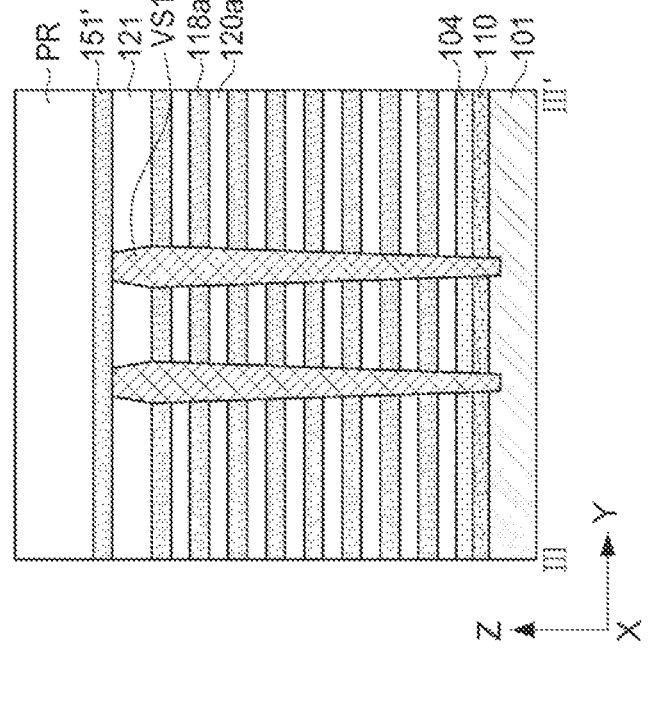
Figure 17C:
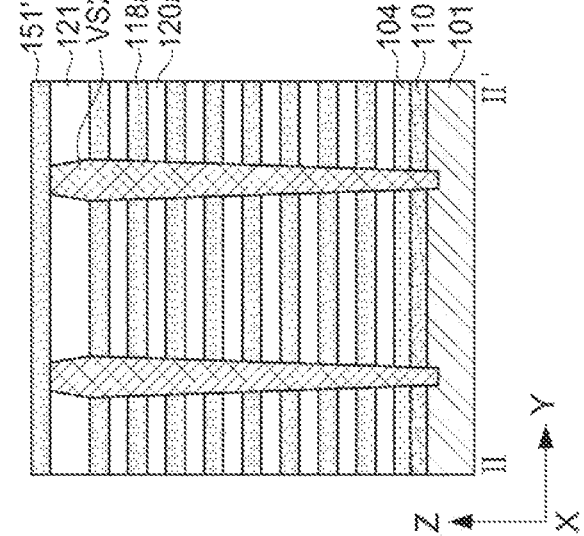

Referring to FIG. 17C, a capping layer 151' may be formed on the connection insulating layer 121, the first vertical structure VS1, and the second vertical structure VS2, and the capping layer 151', and a photomask PR may be selectively formed on the capping layer 151'.

The capping layer 151' may protect the first vertical structure VS1 from being removed when the second vertical structure VS2 is removed in a subsequent process. The thickness of the capping layer 151' may be the same as the thickness of the lower sacrificial insulating layers 118*a*, but an example embodiment thereof is not limited thereto and the thickness may be varied. The capping layer 151' may include at least one of silicon oxide, silicon nitride, or silicon oxynitride. The capping layer 151' may include, for example, the same material as that of the lower sacrificial insulating layers 118*a*.

The photomask PR may be formed by forming a photoresist material on the connection insulating layer 121, and partially removing the photoresist material from the region in which the first align structure AS1 (see FIG. 4) is formed. Accordingly, the etch mask PR may be selectively disposed only in regions in which the plurality of memory structures M1 and M2 (see FIG. 4) are formed.

Figure 17D:
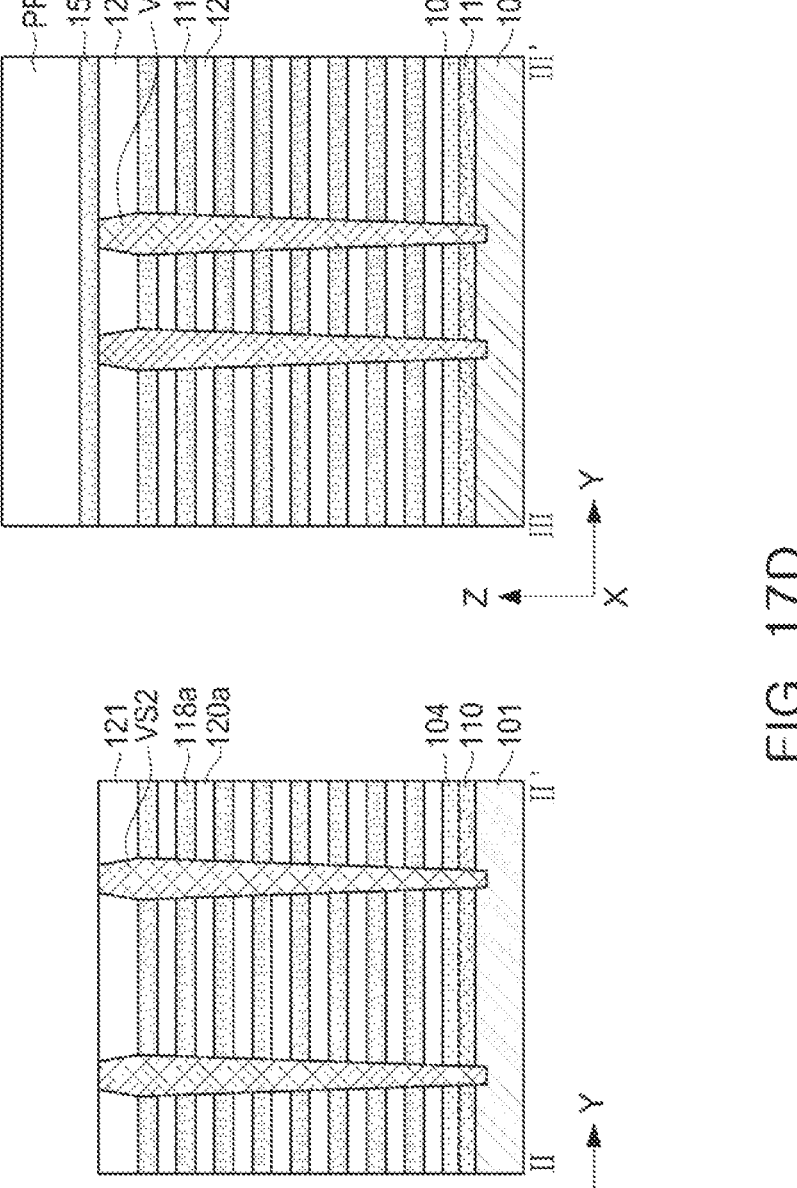

Referring to FIG. 17D, only the capping layer 151' disposed in the region in which the first align structure AS1 (see FIG. 4) is formed may be removed by etching using the photomask PR. Accordingly, the upper surface of the second vertical structure VS2 may be exposed. The capping layer 151' may remain in a region in which the plurality of memory structures M1 and M2 (see FIG. 4) are formed.

Figure 17E:
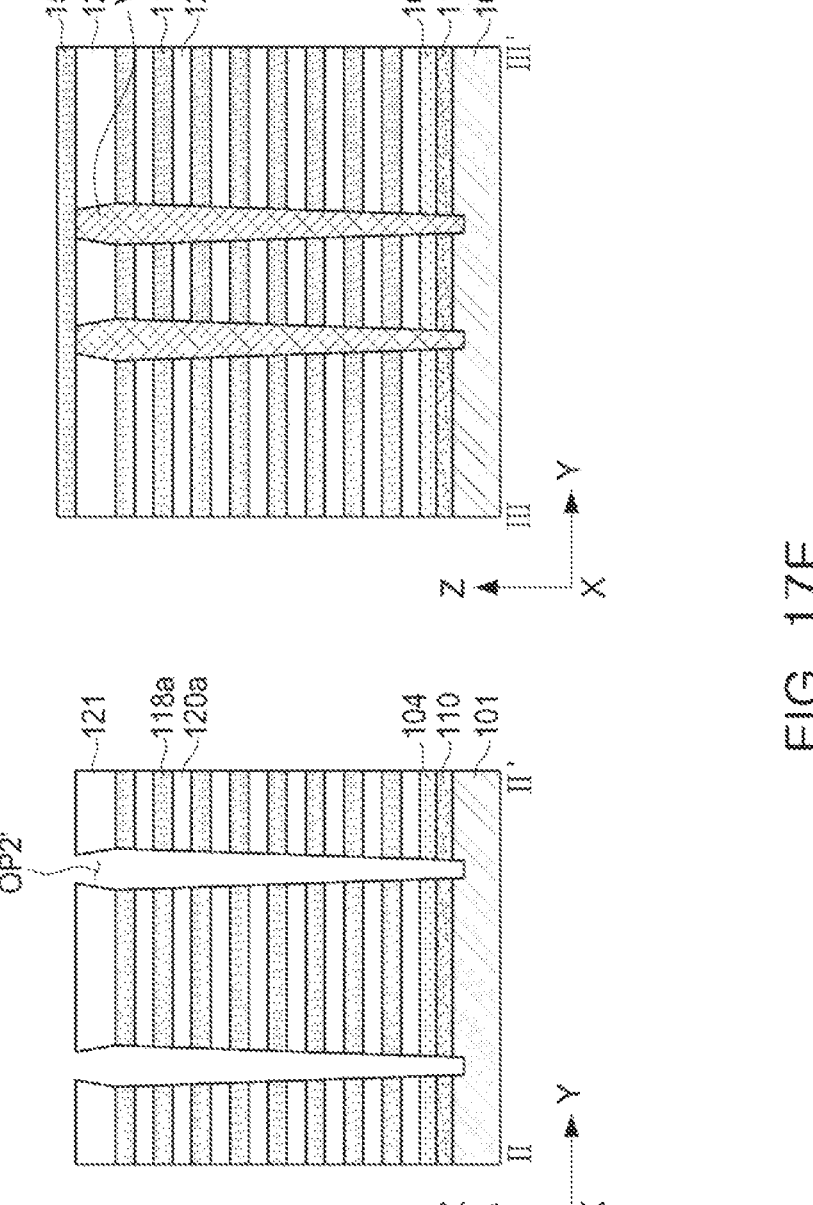

Referring to FIG. 17E, the photomask PR and the second vertical structure VS2 may be removed. During an ashing, process of removing the photomask PR, the second vertical structure VS2 may also be removed through the exposed upper surface of the second vertical structure VS2. As the second vertical structure VS2 is removed, the second opening OP2' may be formed again.

In an example embodiment, when the second vertical structure VS2 includes carbon, the second vertical structure VS2 may be easily removed when the photomask PR is removed through the ashing process. Accordingly, when the second vertical structure VS2 includes carbon, it may be difficult for the second vertical structure VS2 to remain without being removed in the ashing process for the photomask PR and to work as an align key structure.

Figure 17F:
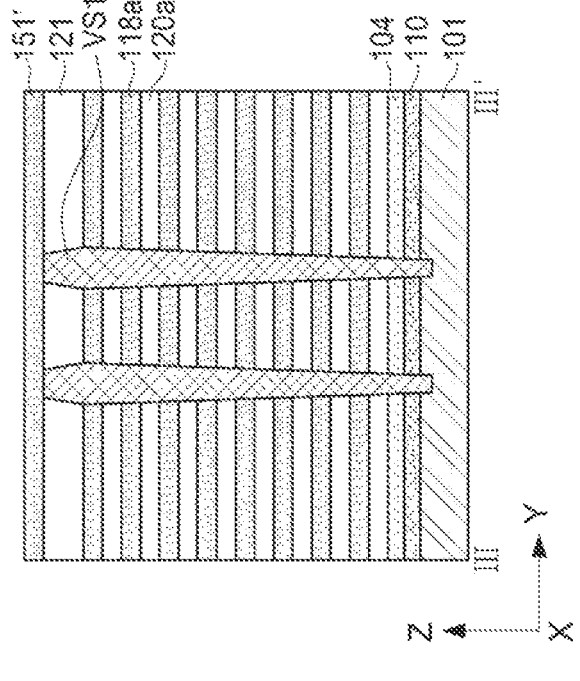

Referring to FIG. 17F, the first align key structure 150 may be formed in the second opening OP2'. The first align key structure 150 may be formed by filling the second opening OP2' with at least one of a conductive material, silicon, and a dielectric material, and removing a portion of the material covering the insulating layer 121 and the capping layer 151' continuously formed by a chemical mechanical polishing (CMP) process. Since the material is formed of a material having etch resistance higher than that of the connection insulating layer 121, the connection insulating layer 121 may be selectively etched in a subsequent process. In an example embodiment, the material may be formed of a single material layer.

Figure 17G:
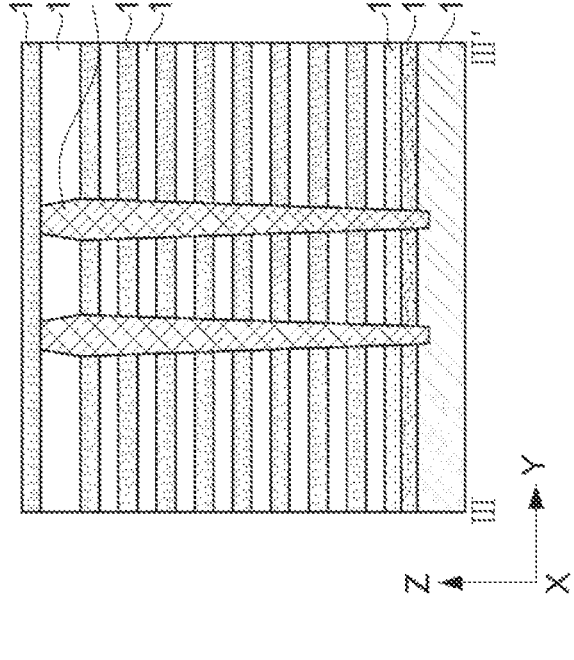
Figure 17G:
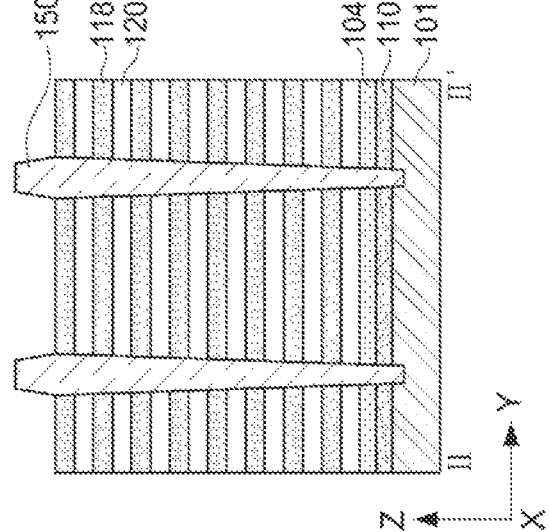

Referring to FIG. 17G, the connection insulating layer 121 disposed in the region in which the first align structure AS1 (see FIG. 4) is formed may be selectively removed. The capping layer 151' may be disposed on the upper surface of the connection insulating layer 121 disposed in the region in which the plurality of memory structures M1 and M2 (see FIG. 4) are formed, such that the connection insulating layer 121 may be protected in the etching process. The first align key structure 150 disposed in the region in which the first align structure AS1 will be formed later, may have etch resistance higher than that of the connection insulating layer 121, and thus may remain without being etched. Accordingly, a portion of the connection insulating layer 121 may be selectively removed. As the connection insulating layer 121 covering a portion of the side surface of the first align key structure 150 is removed, the upper surface and at least a portion of the side surface of the first align key structure 150 may be exposed.

In this process, a portion of the first align key structure 150 may be removed together such that the level of the upper surface of the first align key structure 150 may be lowered. However, even in this case, the first align key structure 150 may have etch resistance higher than that of the connection insulating layer 121 such that the first align hey structure 150 may be removed by a thickness smaller than that of the connection insulating layer 121. Accordingly, the semiconductor device in FIG. 5 may be provided.

In this process, the connection insulating layer 121 may not be completely removed in the region in which the first align structure AS1 (see FIG. 4) is formed, and may partially remain. Accordingly, the semiconductor device in FIG. 6 may be provided.

In this process, only the corner portion of the first align key structure 150 may be partially removed such that the corner may have a partially rounded shape. Accordingly, the semiconductor device in FIG. 7 may be provided.

Figure 17H:
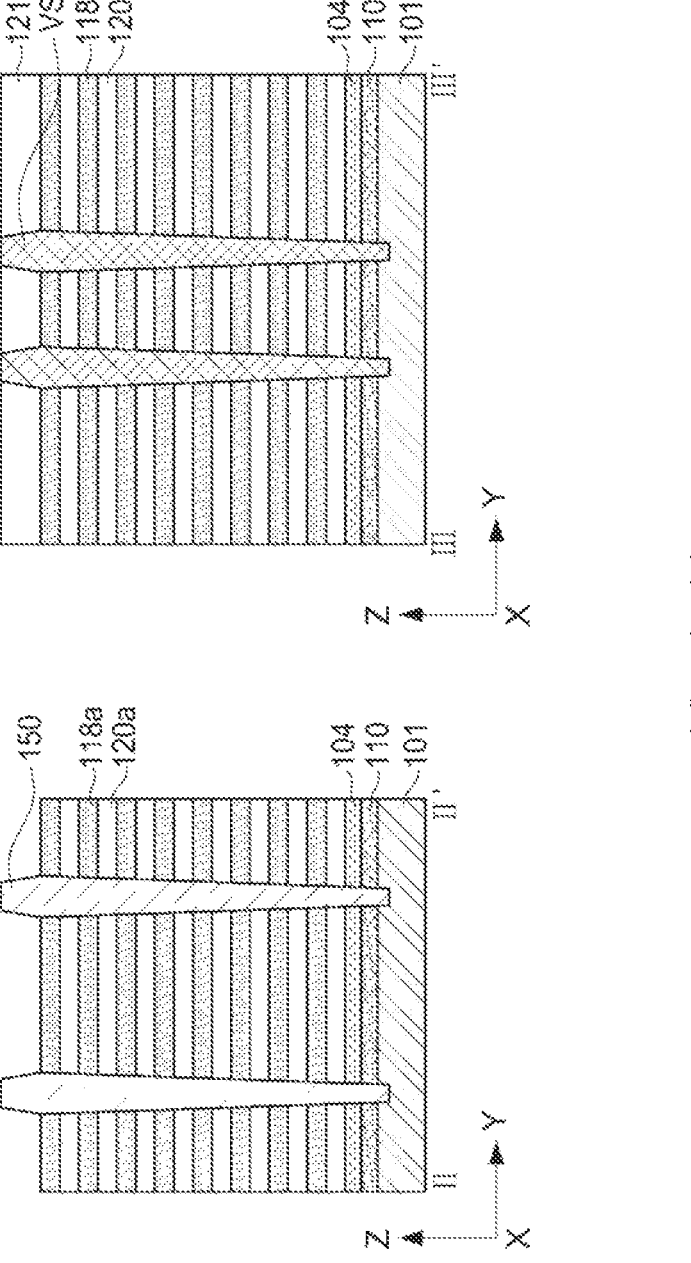

Referring to FIG. 17H, the capping layer 151' may be removed. Accordingly, in the region in which the plurality of memory structures M1 and M2 (see FIG. 4) will be formed later, the first vertical structure VS1 and the connection insulating layer 121 may have the same upper surface, whereas, in the region in which the first align structure AS1 (see FIG. 4) is formed, the upper surface of the first align key structure 150 may be disposed on a level higher than a level of the upper surface of the lower sacrificial insulating layer 118a disposed on the uppermost portion. That is, a step difference may be formed due to a difference in heights between the first, align key structure 150 and the lower sacrificial insulating layer 118a disposed in the uppermost portion.

Figure 17I:
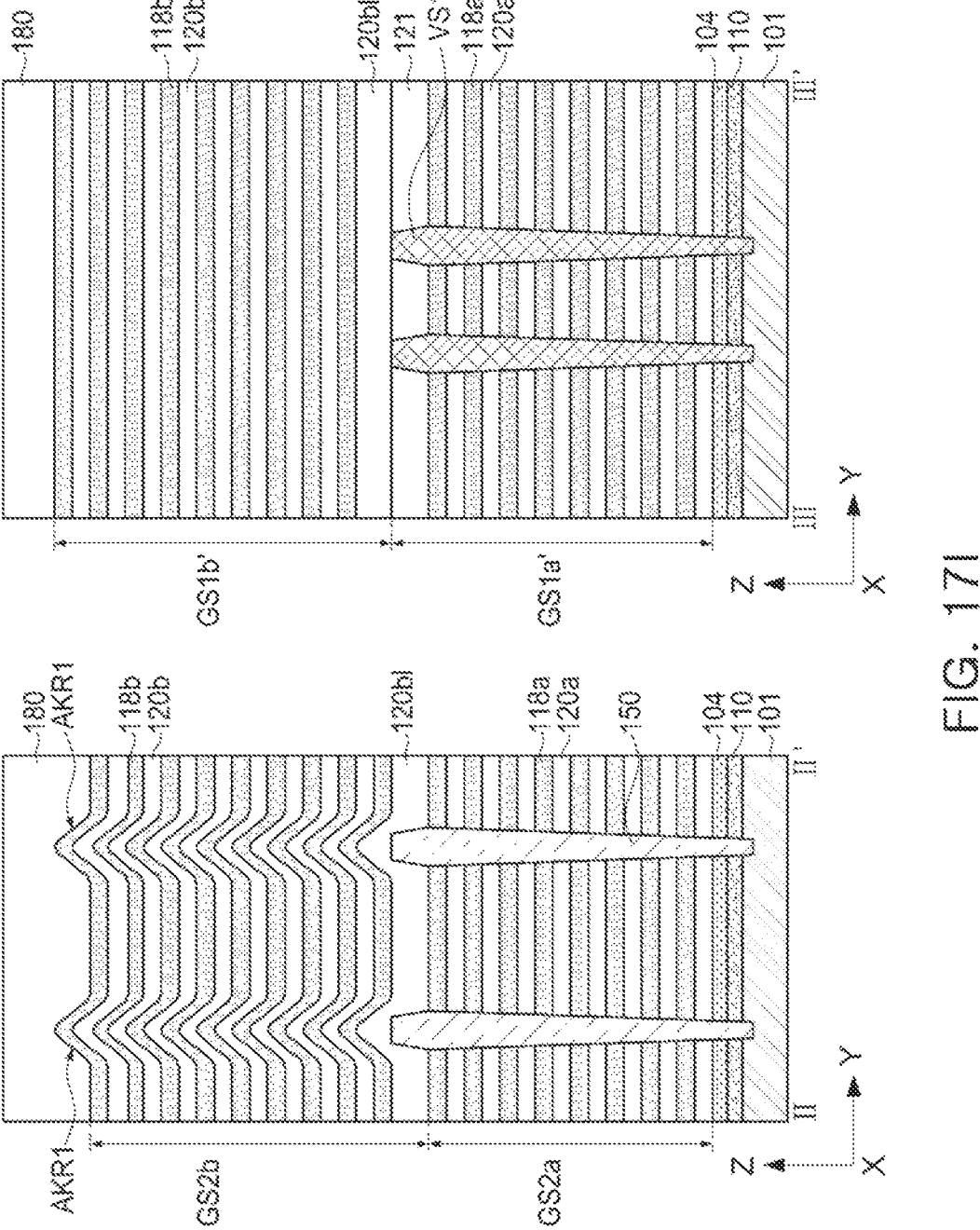

Referring to FIG. 17I, the first upper stack structure GS1b' may be formed on the first lower stack structure GS1a'. The first lower stack structure GS1a' may include lower sacrificial insulating layers 118a, lower interlayer insulating layers 120a, and a connection insulating layer 121 disposed in a region in which the plurality of memory structures M1 and M2 (see FIG. 4) will be formed later. The first upper stack structure GS1b' may be formed by alternately stacking the upper sacrificial insulating layers 118b and the upper interlayer insulating layers 120b.

In this process, the second upper stack structure GS2b may be formed on the second lower stack structure GS2a. The second lower stack structure GS2a may include lower sacrificial insulating layers 118a and lower interlayer insulating layers 120a disposed in a region in which the first align structure AS1 (see FIG. 4) will be formed later. The second upper stack structure GS2b may be formed by alternately stacking the upper sacrificial insulating layers 118b and the upper interlayer insulating layers 120b. The second upper stack structure GS2b may have a first align key region having an outwardly curved shape due to a step difference formed by the first align key structure 150. That is, the upper surface of the second upper stack structure GS2b on the first align key structure 150 may be higher than the level of the upper surface of the second upper stack structure GS2b on the second lower stack structure GS2a.

The upper interlayer insulating layers 120b may include the same material as that of the lower interlayer insulating layers 120a, and the upper sacrificial insulating layers 118b may include the same material as that of the lower sacrificial insulating layers 118a.

In example embodiments, the thicknesses of the upper interlayer insulating layers 120b may not be the same. The thicknesses of the upper interlayer insulating layers 120b and the upper sacrificial insulating layers 118b and the number of the layers included therein may be varied from the illustrated examples.

Thereafter, the upper insulating layer 180 may be formed on the first and second upper stack structures GS1b' and GS2b.

Figure 17J:
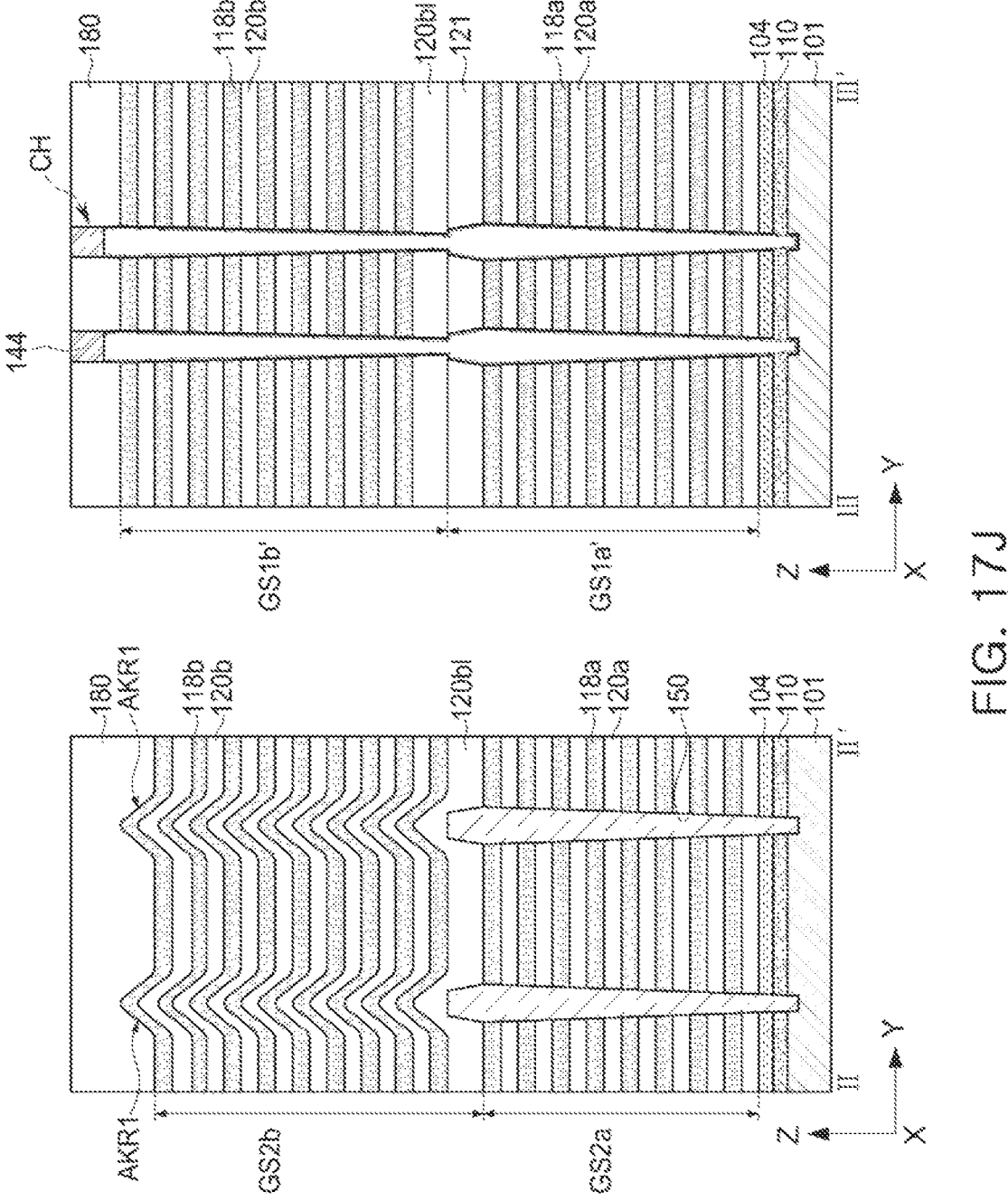

Referring to FIG. 17J, the channel structures CH penetrating the first stack structures GS1a' and GS1b' may be formed. An upper channel hole may be formed by etching the first upper stack structure on the first vertical structure VS1, and the exposed first vertical structure VS1 may be removed through the upper channel hole. Accordingly, a channel hole in which the lower channel hole of the region from which the first vertical structure VS1 is removed is connected to an upper channel hole may be formed.

In this process, to address the issue in alignment of photomask for forming the upper channel hole on the first vertical structure VS1 having a fine width, the first align key region AKR1 of the second upper stack structure GS2b may be used. Accordingly, the lower channel hole and the upper channel hole may be aligned, may be connected to each other, and may have the same central axis. In some embodiments, a central axis of the lower channel hole in the direction Y may be aligned with a central axis of the upper channel hole in the direction Y as illustrated in FIG. 17J.

The channel structures CH may be formed by forming the channel layer 140 (see FIG. 4), the gate dielectric layer 143 (see FIG. 4), the channel buried insulating layer 142 (see FIG. 4), and the channel pad 144 (see FIG. 4) in the channel hole. The gate dielectric layer 143 may be formed to have a substantially uniform thickness. The channel layer 140 may be formed on the gate dielectric layer 143 in the channel structures CH. The channel buried insulating layer 142 may be formed to fill the channel structures CH, and may be an insulating material. However, in example embodiments, the channel buried insulating layer 142 may fill the space between the channel layers 140 with a conductive material. The channel pad 144 may be formed of a conductive material, such as, for example, polycrystalline silicon.

Figure 17K:
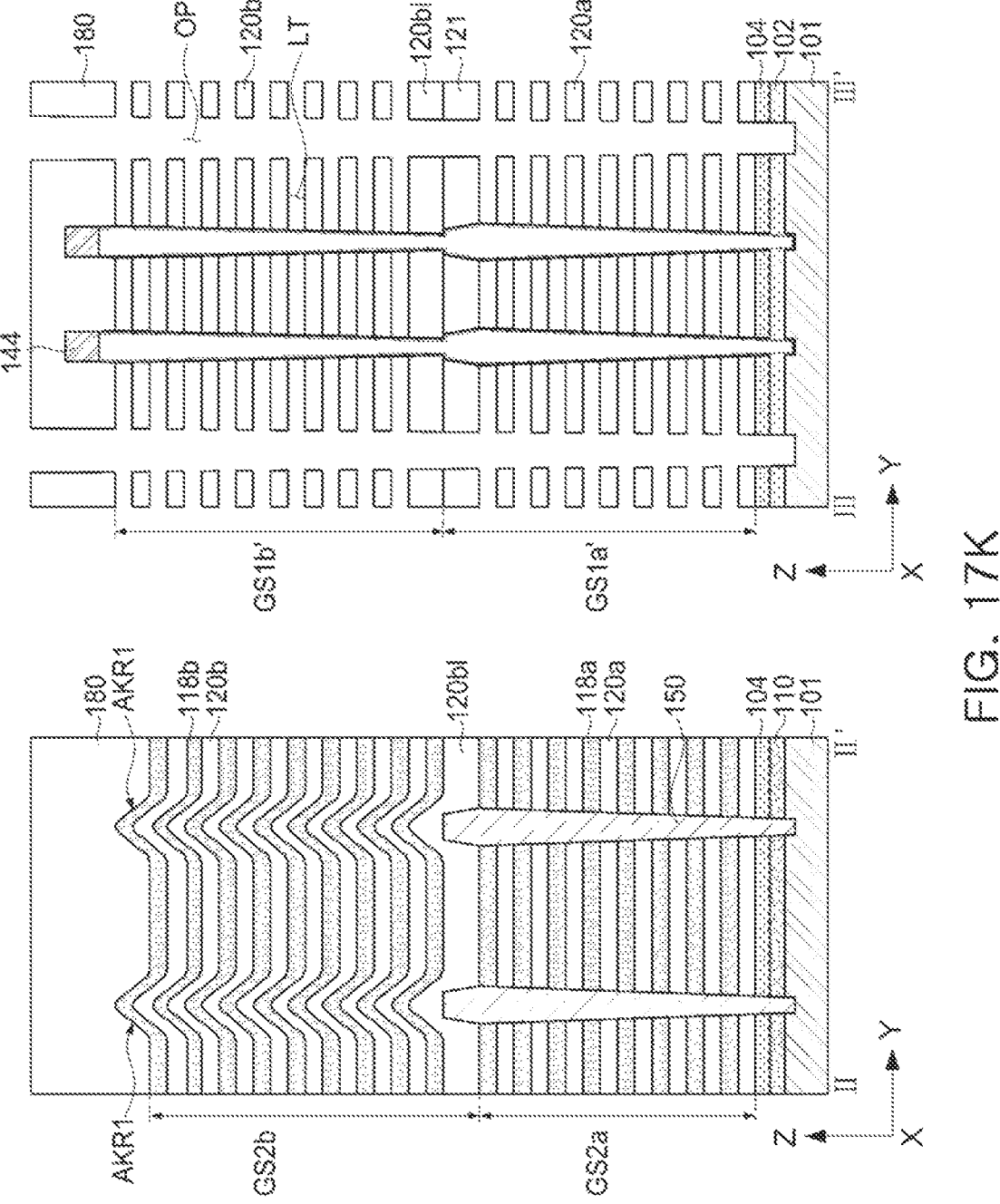

Referring to FIG. 17K, an opening OP penetrating the first lower stack structure GS2*s'* and the first upper stack structure GS1*b'* may be formed, the horizontal insulating layer 110 may be removed through the opening OP, and the lower sacrificial insulating layers 118*a* and the upper sacrificial insulating layers 118*b* may be removed.

The opening OP may be formed in a region corresponding to the separation region MS (see FIGS. 2 and 4), and may be formed in the form of a trench extending in the x-direction.

A portion of the horizontal insulating layer 110 and a portion of the gate dielectric layer 145 (see FIG. 4) on the first region R1 (see FIG. 2) may be replaced with the first horizontal conductive layer 102 through the opening OP. The horizontal insulating layer 110 may remain in the region in which the second region R2 (see FIG. 2) and the first align structure AS1 (see FIG. 4) are formed.

Thereafter, the lower sacrificial insulating layers 118*a*, and the upper sacrificial insulating layers 118*b* may be removed through the opening OP. For example, the lower sacrificial insulating layers 118*a* and the upper sacrificial insulating layers 118*b* may be selectively removed using isotropic etching. Accordingly, sidewalls of the channel structures CH may be partially exposed between the lower interlayer insulating layers 120*a* and between the upper interlayer insulating layers 120*b*. By removing the lower sacrificial insulating layers 118*a* and the upper sacrificial insulating layers 118*b*, horizontal openings LT may be formed.

Figure 17L:
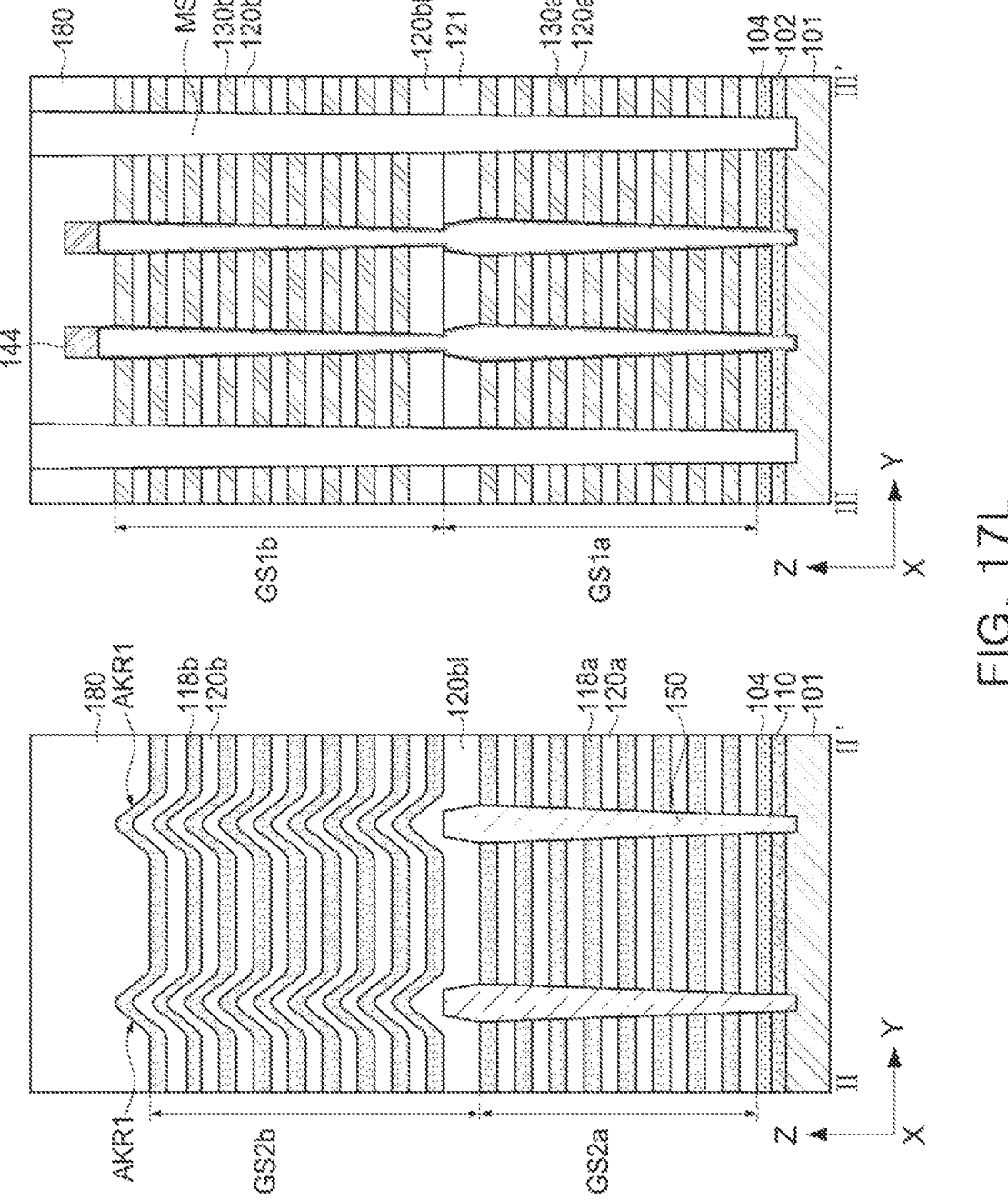

Referring to FIG. 17L, separation structures MS may be formed by forming lower gate electrodes 130*a* and upper gate electrodes 130*b* in horizontal openings LT, and filling the opening OP with an insulating material.

The lower gate electrodes 130*a* and the upper gate electrodes 130*b* may be formed by filling a conductive material in a region from which the lower sacrificial insulating layers 118*a* and the upper sacrificial insulating layers 118*b* are removed. The lower gate electrodes 130*a* and the upper gate electrodes 130*b* may include a metal, polycrystalline silicon, or a metal silicide material.

Thereafter, the separation structures MS may be formed by filling the opening OP with an insulating material.

Thereafter, by forming the upper contact structures 182 and the upper wirings 184, the semiconductor device 100 in FIG. 4 may be formed.

Figure 18A:
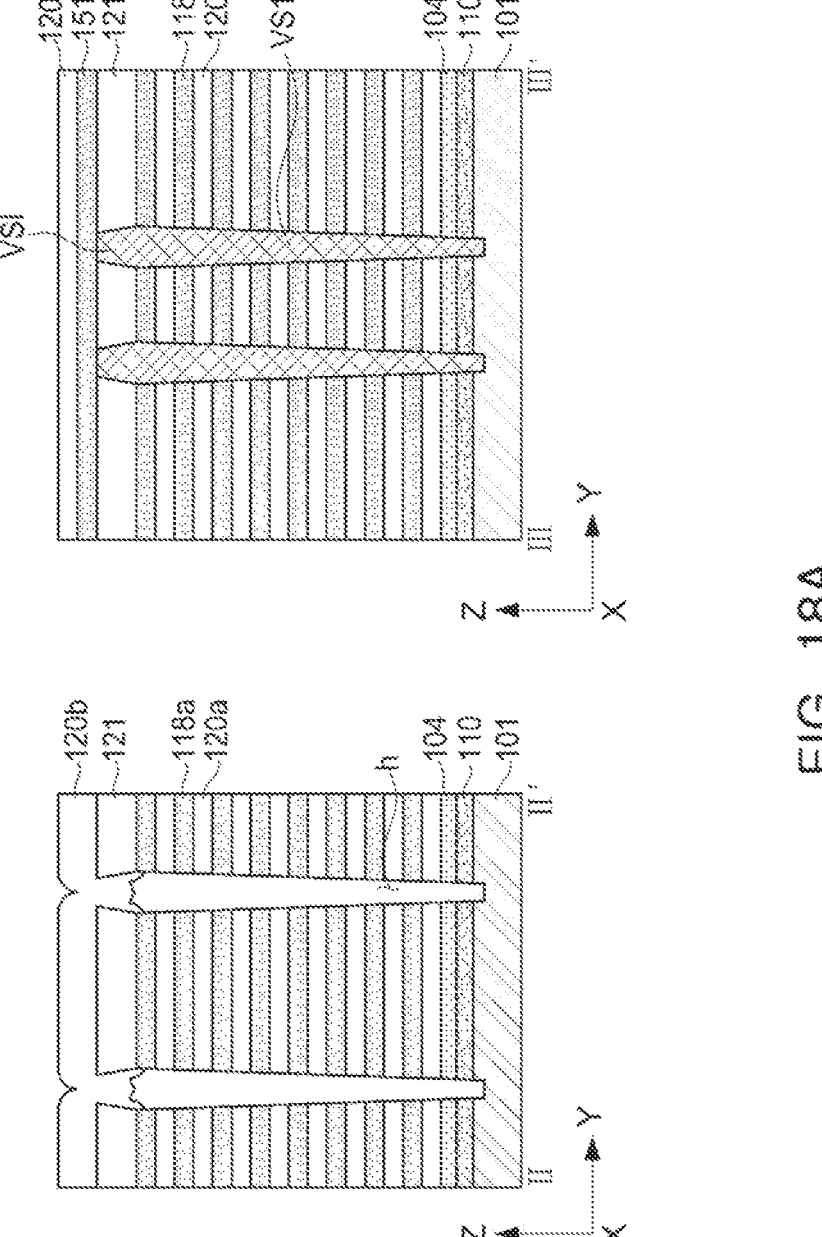
FIGS. 18A to 18C are cross-sectional diagrams illustrating a method of manufacturing a semiconductor device according to an example embodiment of the present inventive concept.
Figure 18B:
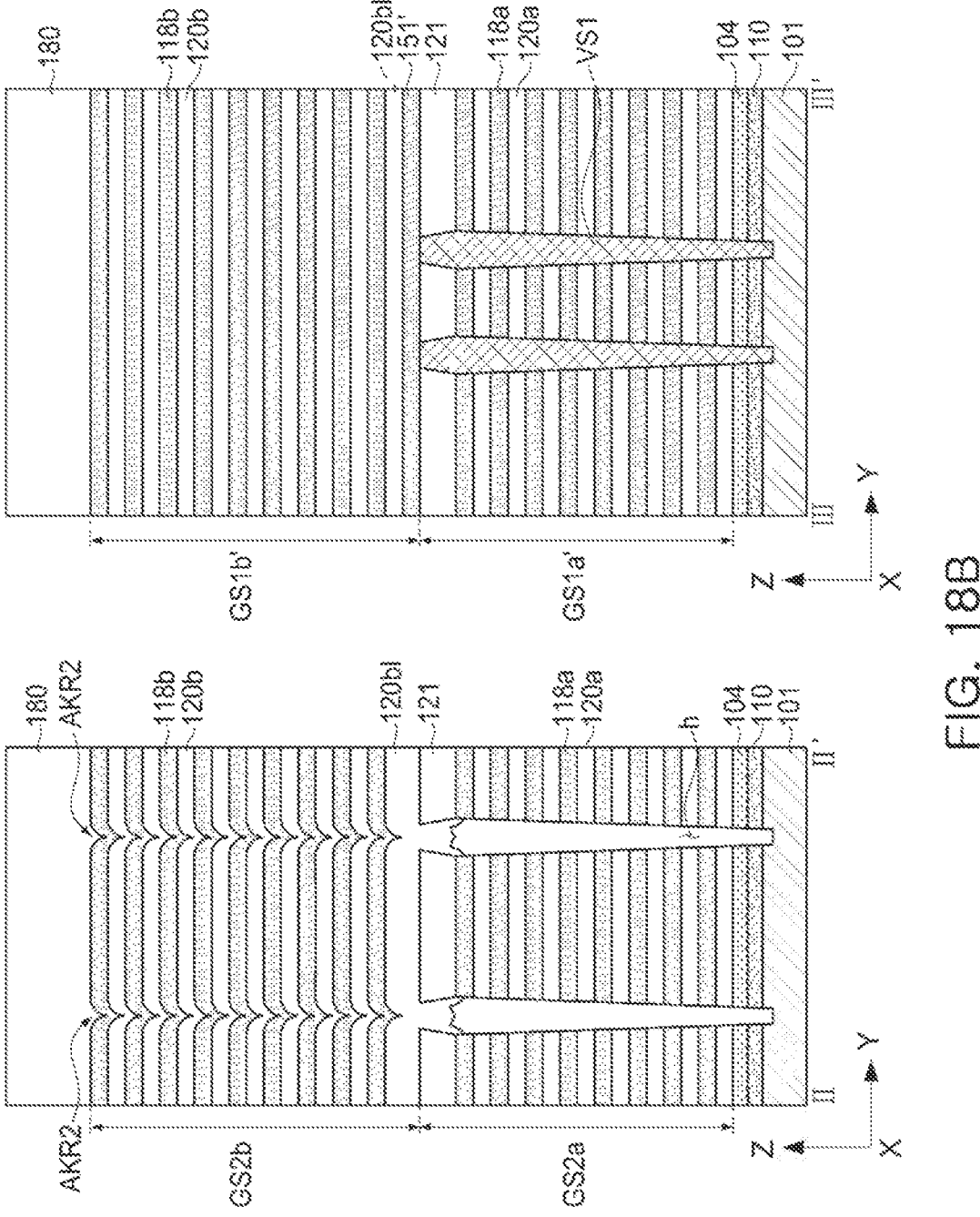
Figure 18C:
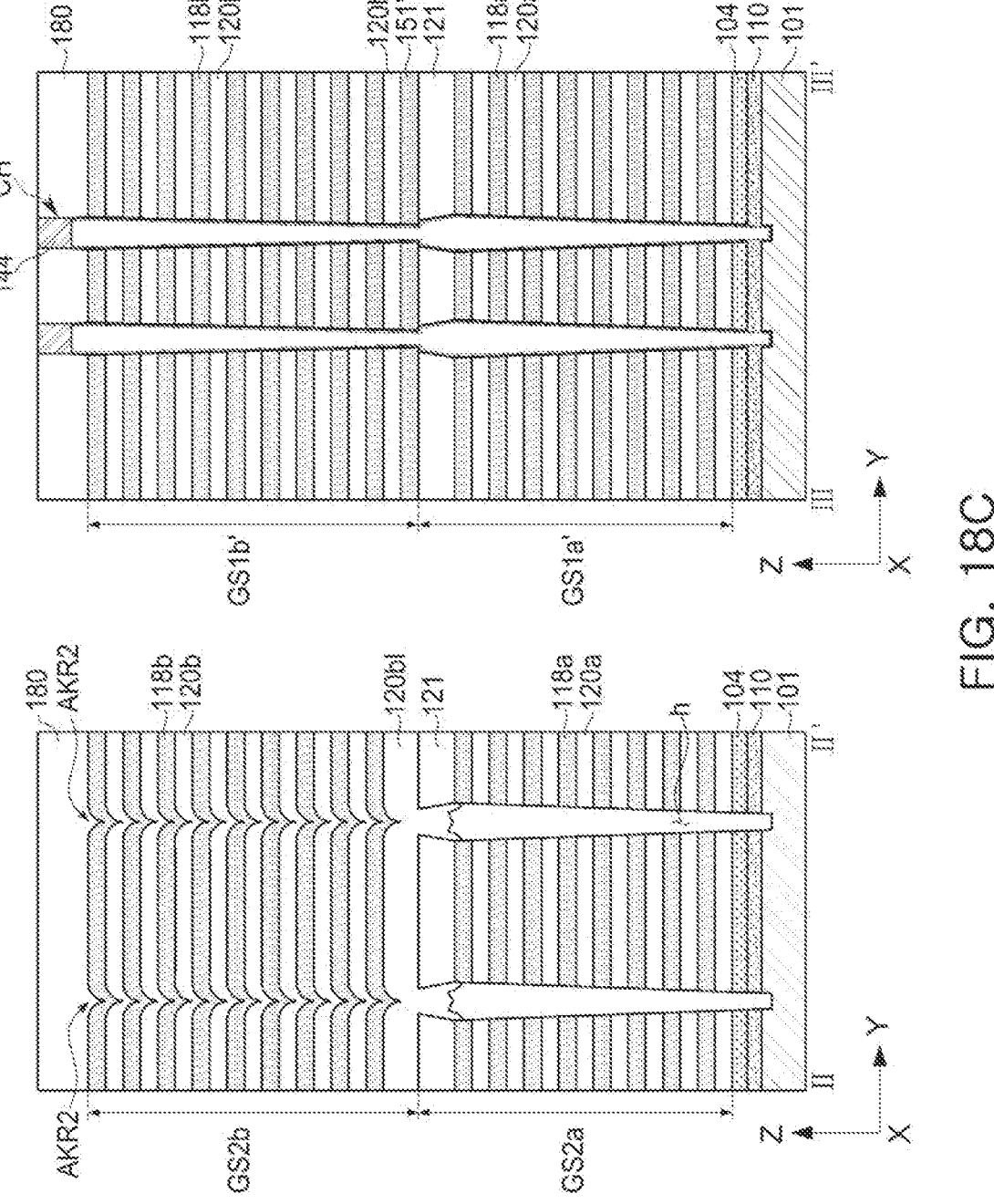

FIGS. 18A to 18C are cross-sectional diagrams illustrating a method of manufacturing a semiconductor device 200 according to an example embodiment, illustrating regions corresponding to FIG. 10.

Referring to FIG. 18A, the same processes described with reference to FIGS. 17A to 17E may be performed, and thereafter, the upper interlayer insulating layer 120*b*1 may be formed without forming the first align key structure 150.

The upper interlayer insulating layer 120*b*1 may be formed on the first lower stack structure GS1*a'* and the second lower stack structure GS2*a*.

The upper interlayer insulating layer 120*b*1 formed on the second lower stack structure GS2*a* may cover the upper end of the side surface of the hole h. Accordingly, the upper interlayer insulating layer 120*b*1 may cover the upper surface and at least a portion of the side surface of the connection insulating layer 121 of the second lower stack structure GS2*a*. In an example embodiment, a portion of the upper interlayer insulating layer 120*b*1 extending along the side surface of the hole h may have a thickness thicker than that of the portion in the central portion of the hole h, but the shape of the insulating layer 120*b*1 is not limited thereto and may be varied. In the process of depositing the upper interlayer insulating layer 120*b*1, as the insulating material extends to a portion of the hole h, the upper interlayer insulating layer 120*b*1 may have an upper surface having an inwardly curved shape on the hole h. Accordingly, the upper surface of the upper interlayer insulating layer 120*b*1 on the hole h may be disposed on a level lower than a level of the upper surface of the upper interlayer insulating layer 120*b*1 on the connection insulating layer 121.

The upper interlayer insulating layer 120*b*1 formed on the first lower stack structure GS1*a'* may be formed by performing the same deposition process performed for the interlayer insulating layer 120*b*1 formed on the second lower stack structure GS2*a* and performing a chemical mechanical polishing process. Accordingly, the upper interlayer insulating layer 120*b*1 formed on the first lower stack structure GS1*a'* and the upper interlayer insulating layer 120*b*1 formed on the second lower stack structure GS2*a* may be disposed on the same level. However, in example embodiments, the chemical mechanical polishing process may not be performed.

Referring to FIG. 18B, the first upper stack structure GS1*b'* and the second upper stack structure GS2*b* may be formed by alternately stacking the upper sacrificial insulating layers 118*b* and the other upper interlayer insulating layers 120*b* on the upper interlayer insulating layer 120*b*1. As the upper sacrificial insulating layers 118*b* and the other upper interlayer insulating layers 120*b* are stacked in the same shape as that of the upper interlayer insulating layer 120*b*1, the second upper stack structure GS2*b* formed on the hole h may have an inwardly curved shape. That is, the upper surface of the second upper stack structure GS2*b* formed on the hole h may be disposed on a level lower than a level of the upper surface of the second upper stack structure GS2*b* formed on the connection insulating layer 121.

Referring to FIG. 18C, channel structures CH penetrating the first stack structures GS1*a'* and GS1*b'* may be formed. An upper channel hole may be formed by etching the first upper stack structure GS1*b'* on the first vertical structure VS1, and the first vertical structure VS1 exposed through the upper channel hole may be removed. Accordingly, a channel hole in which a lower channel hole in the region from which the first vertical structure VS1 is removed is connected to the upper channel hole may be formed.

In this process, the inwardly curved shape of the second upper stack structure GS2*b* may be used to address the issues in alignment of photomask for forming the upper channel hole on the first vertical structure VS1 having a fine width. Accordingly, the lower channel hole and the upper channel hole may be aligned, may be connected to each other, and may have the same central axis.

The channel structures CH may be formed by forming the channel layer 140 (see FIG. 4), the gate dielectric layer 143

(see FIG. 4), the channel buried insulating layer 142 (see FIG. 4), and the channel pad 144 (see FIG. 4) in the channel hole. The gate dielectric layer 143 may be formed to have a uniform thickness. The channel layer 140 may be formed on the gate dielectric layer 143 in the channel structures CH. The channel buried insulating layer 142 may be formed to fill the channel structures CH, and may be an insulating material. However, in example embodiments, the channel buried insulating layer 142 may fill the space between the channel layers 140 with a conductive material. The channel pad 144 may be formed of a conductive material, such as, for example, polycrystalline silicon.

Thereafter, the same processes described with reference to FIGS. 17K and 17L may be performed, and upper contact structures 182 and upper wirings 184 may be formed, thereby forming the semiconductor device 200 in FIG. 10.

According to the aforementioned example embodiments, by changing the shape of the upper stack structure by forming an align key structure penetrating the lower stack structure, and using the changed shape, a semiconductor device having improved production yield, and a data storage system including the same may be provided.

While the example embodiments have been illustrated and described above, it will be apparent to those skilled in the art that modifications and variations could be made without departing from the scope of the present inventive concept as defined by the appended claims.

What is claimed is:

1. A semiconductor device comprising:
   a first stack structure including interlayer insulating layers and gate electrodes alternately stacked in a first direction perpendicular to an upper surface of a substrate on a first region of the substrate, the first stack structure including a first lower stack structure on the substrate and a first upper stack structure on the first lower stack structure;
   a second stack structure including the interlayer insulating layers and sacrificial insulating layers alternately stacked in the first direction on a second region of the substrate outside of the first region of the substrate, the second stack structure including a second lower stack structure on the substrate and a second upper stack structure on the second lower stack structure;
   a channel structure penetrating the first upper stack structure and the first lower stack structure, extending in the first direction, and including a channel layer; and
   an align key structure penetrating the second lower stack structure and extending in the first direction,
   wherein the second upper stack structure comprises a first align key region on the align key structure.

2. The semiconductor device of claim 1,
   wherein at least one interlayer insulating layer and at least one sacrificial insulating layer of the second upper stack structure are farther than an uppermost surface of the align key structure from the upper surface of the substrate, and
   wherein the at least one interlayer insulating layer and the at least one sacrificial insulating layer of the second upper stack structure overlap the uppermost surface of the align key structure in the first direction.

3. The semiconductor device of claim 1, wherein an upper surface of the second lower stack structure is closer than an upper surface of the align key structure and an upper surface of the first lower stack structure to the upper surface of the substrate.

4. The semiconductor device of claim 3, wherein a lowermost interlayer insulating layer of the second upper stack structure covers the upper surface and at least a portion of a side surface of the align key structure.

5. The semiconductor device of claim 1, wherein a first portion of an upper surface of the second upper stack structure on the align key structure is farther than a second portion of the upper surface of the second upper stack structure on the second lower stack structure from the upper surface of the substrate.

6. The semiconductor device of claim 5,
   wherein the first portion of the upper surface of the second upper stack structure on the align key structure and an upper surface of the first upper stack structure are equidistant from the upper surface of the substrate, and
   wherein the second portion of the upper surface of the second upper stack structure on the second lower stack structure is closer than the upper surface of the first upper stack structure to the upper surface of the substrate.

7. The semiconductor device of claim 1,
   wherein the channel structure includes a lower channel structure penetrating the first lower stack structure and an upper channel structure penetrating the first upper stack structure,
   wherein the lower channel structure is connected to the upper channel structure, and
   wherein an uppermost end of the lower channel structure and an uppermost end of the align key structure are equidistant from the upper surface of the substrate.

8. The semiconductor device of claim 1, wherein the first align key region overlaps the align key structure in the first direction and includes portions of the respective sacrificial insulating layers slanted with respect to the upper surface of the substrate.

9. The semiconductor device of claim 1, wherein the align key structure includes a single material layer.

10. The semiconductor device of claim 1,
    wherein the channel structure includes a lower channel structure penetrating the first lower stack structure and an upper channel structure penetrating the first upper stack structure,
    wherein the lower channel structure is connected to the upper channel structure, and
    wherein an uppermost end of the align key structure is closer than an uppermost end of the lower channel structure to the upper surface of the substrate.

11. The semiconductor device of claim 1,
    wherein an upper surface of the second lower stack structure is closer than an upper surface of the first lower stack structure to the upper surface of the substrate, and
    wherein an upper surface of the align key structure and the upper surface of the first lower stack structure are equidistant from the upper surface of the substrate.

12. The semiconductor device of claim 1, wherein a thickness of an uppermost sacrificial insulating layer of the second lower stack structure is thinner than a thickness of one of the sacrificial insulating layers of the second lower stack structure.

13. The semiconductor device of claim 1, further comprising:
    a lower structure including a base substrate and a peripheral circuit on the base substrate,
    wherein the substrate is on the lower structure.

14. A semiconductor device comprising:
    a first structure including gate electrodes stacked and spaced apart from each other in a first direction perpendicular to an upper surface of a substrate on a first region of the substrate, and a channel structure penetrating the gate electrodes, extending in the first direction, and including a channel layer; and a second structure including a lower stack structure including lower sacrificial insulating layers and lower interlayer insulating layers alternately stacked in the first direction on a second region of the substrate, an align key structure penetrating the lower stack structure and extending in the first direction, and an upper stack structure including upper sacrificial insulating layers and upper interlayer insulating layers alternately stacked in the first direction on the lower stack structure and the align key structure, wherein a first portion of an upper surface of the upper stack structure on the align key structure and a second portion of the upper surface of the upper stack structure on the lower stack structure are at different distances from the upper surface of the substrate.

15. The semiconductor device of claim 14, wherein the align key structure includes a single material layer penetrating the lower stack structure, is in contact with the substrate, and comprises an inclined side surface, and wherein the upper stack structure includes a first align key region on the align key structure.

16. The semiconductor device of claim 14, wherein the align key structure includes a gap penetrating the lower stack structure, is in contact with the substrate, and comprises an inclined side surface, and wherein the upper stack structure includes a second align key region on the align key structure.

17. The semiconductor device of claim 14, wherein the align key structure includes metal, polysilicon, a dielectric material, and/or titanium nitride (TiN).

18. A data storage system comprising:

a main substrate;

a semiconductor device on the main substrate; and a controller electrically connected to the semiconductor device on the main substrate, wherein the semiconductor device includes:

a first stack structure including interlayer insulating layers and gate electrodes alternately stacked in a first direction perpendicular to an upper surface of a substrate on a first region of the substrate, the first stack structure including a first lower stack structure on the substrate and a first upper stack structure on the first lower stack structure;

a second stack structure including the interlayer insulating layers and sacrificial insulating layers alternately stacked in the first direction on a second region of the substrate outside of the first region of the substrate, the second stack structure including a second lower stack structure on the substrate and a second upper stack structure on the second lower stack structure;

a channel structure penetrating the first upper stack structure and the first lower stack structure, extending in the first direction, and including a channel layer;

an align key structure penetrating the second lower stack structure and extending in the first direction;

a peripheral circuit including circuit devices electrically connected to the gate electrodes or the channel structure; and an input/output pad electrically connected to the peripheral circuit, wherein the second upper stack structure comprises a first align key region on the align key structure.

19. The data storage system of claim 18, wherein an upper surface of the second lower stack structure is closer than an upper surface of the align key structure to the upper surface of the substrate, and wherein the second upper stack structure covers at least a portion of a side surface and the upper surface of the align key structure.

20. The semiconductor device of claim 14, wherein the first portion of an upper surface of the upper stack structure comprises a protrusion or recess overlapping the align key structure in the first direction.

* * * * *